(12) United States Patent
Lee et al.

(10) Patent No.: US 12,353,656 B2
(45) Date of Patent: Jul. 8, 2025

(54) DISPLAY DEVICE INCLUDING A CONDUCTIVE PORTION COVERING AN AREA IN WHICH CLOCK SIGNAL LINES AND TOUCH SIGNAL LINES OVERLAP

(71) Applicant: Samsung Display Co., Ltd., Yongin-si (KR)

(72) Inventors: Jaehyun Lee, Seoul (KR); Keunlim Ku, Hwaseong-si (KR); Sanghyun Jun, Suwon-si (KR); Changyong Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/722,366

(22) Filed: Apr. 17, 2022

(65) Prior Publication Data

US 2022/0236825 A1  Jul. 28, 2022

Related U.S. Application Data

(63) Continuation of application No. 16/865,907, filed on May 4, 2020, now Pat. No. 11,307,691, which is a
(Continued)

(30) Foreign Application Priority Data

Jul. 29, 2016 (KR) .................. 10-2016-0097497

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/041* (2013.01); *G06F 3/04164* (2019.05);
(Continued)

(58) Field of Classification Search
None
See application file for complete search history.

(56) References Cited

U.S. PATENT DOCUMENTS

| | | |
|---|---|---|
| 7,057,589 B2 | 6/2006 | Shin et al. |
| 8,531,616 B2 | 9/2013 | Shin et al. |
| (Continued) | | |

FOREIGN PATENT DOCUMENTS

| | | |
|---|---|---|
| CN | 102043555 | 5/2011 |
| CN | 102478737 A | 5/2012 |
| (Continued) | | |

OTHER PUBLICATIONS

Non-Final Office Action dated Mar. 1, 2019, in U.S. Appl. No. 15/658,351.
(Continued)

*Primary Examiner* — Amr A Awad
*Assistant Examiner* — Donna V Bocar
(74) *Attorney, Agent, or Firm* — Womble Bond Dickinson (US) LLP

(57) ABSTRACT

A display device including a circuit layer having a driving circuit layer with a plurality of clock signal lines, a touch detection unit having a touch detection part and a plurality of touch signal lines electrically connected to the touch detection unit, and a conductive portion disposed between the plurality of clock signal lines and the plurality of touch signal lines and configured to cover an overlapping area where the plurality of clock signal lines and the plurality of touch signal lines overlap.

18 Claims, 39 Drawing Sheets

US 12,353,656 B2
Page 2

Related U.S. Application Data continuation of application No. 15/658,351, filed on Jul. 24, 2017, now Pat. No. 10,642,390.

(51) Int. Cl.
| | |
|---|---|
| *G09G 3/3225* | (2016.01) |
| *G09G 3/3233* | (2016.01) |
| *G09G 3/3266* | (2016.01) |
| *H10K 50/844* | (2023.01) |
| *H10K 59/12* | (2023.01) |
| *H10K 59/131* | (2023.01) |
| *H10K 59/40* | (2023.01) |
| *H10K 59/80* | (2023.01) |
| *H10K 77/10* | (2023.01) |
| *H10K 102/00* | (2023.01) |

(52) U.S. Cl.
CPC .......... *G06F 3/0443* (2019.05); *G06F 3/0445* (2019.05); *G06F 3/0446* (2019.05); *G09G 3/3225* (2013.01); *G09G 3/3233* (2013.01); *G09G 3/3266* (2013.01); *H10K 50/844* (2023.02); *H10K 59/12* (2023.02); *H10K 59/131* (2023.02); *H10K 59/40* (2023.02); *H10K 59/873* (2023.02); *H10K 77/111* (2023.02); *G06F 2203/04102* (2013.01); *G06F 2203/04107* (2013.01); *G06F 2203/04111* (2013.01); *G06F 2203/04112* (2013.01); *G09G 2300/0426* (2013.01); *G09G 2300/0809* (2013.01); *G09G 2300/0819* (2013.01); *G09G 2300/0842* (2013.01); *G09G 2300/0861* (2013.01); *G09G 2310/08* (2013.01); *G09G 2380/02* (2013.01); *H10K 2102/311* (2023.02); *Y02E 10/549* (2013.01)

(56) References Cited

U.S. PATENT DOCUMENTS

| | | | |
|---|---|---|---|
| 9,046,955 B1 | 6/2015 | Lee et al. | |
| 9,152,262 B2 | 10/2015 | Kim et al. | |
| 2005/0156179 A1 | 7/2005 | Yamagata | |
| 2011/0090159 A1 | 4/2011 | Kurashima | |
| 2011/0096017 A1 | 4/2011 | Li et al. | |
| 2011/0133215 A1 | 6/2011 | Kang et al. | |
| 2012/0068994 A1 | 3/2012 | Li et al. | |
| 2012/0268002 A1 | 10/2012 | Osako et al. | |
| 2013/0194204 A1 | 8/2013 | Kang | |
| 2014/0111495 A1 | 4/2014 | Iwase | |
| 2014/0146254 A1* | 5/2014 | Choi | G02F 1/13454 445/24 |
| 2014/0217432 A1 | 8/2014 | Ota et al. | |
| 2015/0034921 A1 | 2/2015 | Kim | |
| 2015/0091030 A1* | 4/2015 | Lee | H10K 59/131 438/34 |
| 2015/0097802 A1 | 4/2015 | Kim et al. | |
| 2015/0144913 A1 | 5/2015 | Shim | |
| 2015/0205418 A1 | 7/2015 | Nam et al. | |
| 2015/0249055 A1 | 9/2015 | Yamamoto | |
| 2016/0027808 A1 | 1/2016 | Kim | |
| 2016/0048248 A1 | 2/2016 | Na et al. | |
| 2016/0062520 A1* | 3/2016 | Choi | H10K 59/123 345/174 |
| 2016/0209959 A1 | 7/2016 | Lee et al. | |
| 2016/0307971 A1* | 10/2016 | Jeon | H01L 22/30 |
| 2017/0090634 A1 | 3/2017 | Yang et al. | |
| 2017/0179432 A1* | 6/2017 | Visweswaran | H10K 59/1213 |
| 2018/0006265 A1* | 1/2018 | Oh | H10K 71/231 |
| 2018/0061918 A1 | 3/2018 | Park et al. | |
| 2018/0348924 A1* | 12/2018 | Li | G06F 3/0443 |

FOREIGN PATENT DOCUMENTS

| | | |
|---|---|---|
| CN | 105278187 A | 1/2016 |
| CN | 105807985 | 7/2016 |
| EP | 1347436 | 9/2003 |
| KR | 20000052152 | 8/2000 |
| KR | 20050020285 | 3/2005 |
| KR | 10-2014-0076850 | 6/2014 |
| KR | 10-2015-0016784 | 2/2015 |
| KR | 10-2015-0087713 | 7/2015 |
| KR | 10-2016-0038571 | 4/2016 |

OTHER PUBLICATIONS

Final Office Action dated Jul. 8, 2019, in U.S. Appl. No. 15/658,351.
Advisory Action dated Sep. 18, 2019, in U.S. Appl. No. 15/658,351.
Notice of Allowance dated Apr. 3, 2020, in U.S. Appl. No. 15/658,351.
Non-Final Office Action dated Jul. 9, 2021, issued to U.S. Appl. No. 16/865,907.
Notice of Allowance dated Dec. 15, 2021, issued to U.S. Appl. No. 16/865,907.

* cited by examiner

DISPLAY DEVICE INCLUDING A CONDUCTIVE PORTION COVERING AN AREA IN WHICH CLOCK SIGNAL LINES AND TOUCH SIGNAL LINES OVERLAP

CROSS-REFERENCE TO RELATED APPLICATION

This application is a Continuation of U.S. patent application Ser. No. 16/865,907, filed on May 4, 2020, which is a Continuation of U.S. patent application Ser. No. 15/658,351, filed Jul. 24, 2017, issued as U.S. Pat. No. 10,642,390, which claims priority from and the benefit of Korean Patent Application No. 10-2016-0097497, filed on Jul. 29, 2016, which are hereby incorporated by reference for all purposes as if fully set forth herein.

BACKGROUND

Field

The invention relates generally to a display device, and, more particularly, to a display device capable of providing substantially uniform touch sensitivity.

Discussion of the Background

Various display devices used for multi-media devices such as televisions, mobile phones, tablet computers, navigations, and game consoles are being developed. A keyboard or a mouse is included as an input device of a display device. Additionally, recent display devices include touch detection units as input devices.

Touch detection units may be extremely sensitive, e.g., in order to detect very light touches or the difference between a valley and a ridge of a fingerprint for identification applications. Sensitive touch detection units can be compromised and produce false or inaccurate results when in close proximity to signals emanating from the display devices.

The above information disclosed in this Background section is only for enhancement of understanding of the background of the inventive concepts, and, therefore, it may contain information that does not form the prior art that is already known in this country to a person of ordinary skill in the art.

SUMMARY

One or more exemplary embodiments of the invention provide a display device including a touch detection unit with a uniform, or more uniform, touch sensitivity unaffected, or less affected, by noise in touch sensor lines, e.g., noise emanating from signals in clock lines in the display device.

Additional aspects will be set forth in the detailed description which follows, and, in part, will be apparent from the disclosure, or may be learned by practice of the inventive concepts.

According to one aspect of the invention, a display device includes a base layer, a circuit layer disposed on the base layer including a pixel circuit layer and a driving circuit layer configured to provide a signal for driving the pixel circuit layer and including a plurality of clock signal lines, an organic light emitting diode disposed on the circuit layer and including a first electrode electrically connected to the pixel circuit layer, an organic light emitting layer disposed on the first electrode, and a second electrode disposed on the organic light emitting layer, a thin film sealing layer disposed on the organic light emitting diode, a touch detection unit disposed on the thin film sealing layer and including a touch detection part and a plurality of touch signal lines electrically connected to the touch detection part and a conductive portion disposed between the plurality of clock signal lines and the plurality of touch signal lines and extending through an overlapping area where the plurality of clock signal lines and at least some of the touch signal lines overlap each other.

In an embodiment, the conductive portion may be disposed on the same layer as the second electrode.

In an embodiment, the second electrode may extend toward the conductive portion and the second electrode and the conductive portion may be connected to each other.

In an embodiment, the second electrode may be spaced apart from the conductive portion.

In an embodiment, the display device may further include a non-overlapping area where at least one of the clock signal lines and at least one of the touch signal lines to not overlap each other.

In an embodiment, a plurality of through holes may be defined in the conductive portion and might not overlap the overlapping area.

In an embodiment, the conductive portion may be disposed on the same layer as one of the first electrode and the second electrode.

In an embodiment, the plurality of through holes may not overlap the plurality of clock signal lines.

In an embodiment, the plurality of through holes may not overlap the plurality of touch signal lines.

In an embodiment, the conductive portion may include a first area, where the plurality of through holes are not defined, overlapping at least one of the clock signal lines and at least one of the touch signal lines, a second area where an area exposed by the plurality of through holes has a first area density of holes, and a third area where an area exposed by the plurality of through holes has a second area density of holes lower than the first area density.

In an embodiment, a number of first through holes defined in the second area per a first surface area may be greater than a number of second through holes defined in the third area per the first surface area.

In an embodiment, a size of first through holes defined in the second area may be greater than a size of second through holes defined in the third area.

In an embodiment, the conductive portion may include a first conductive layer disposed on the same layer as the first electrode and having a plurality of first through holes defined therethrough and a second conductive layer disposed on the same layer as the second electrode.

In an embodiment, the second conductive layer may overlap the plurality of first through holes.

In an embodiment, a plurality of second through holes may be defined in the second conductive layer and the plurality of first through holes and the plurality of second through holes may not overlap each other.

In an embodiment, a plurality of second through holes may be provided in the second conductive layer and the plurality of second through holes are not overlapped with the plurality of touch signal lines or the plurality of clock signal lines.

In an embodiment, the plurality of first through holes may not overlap the plurality of clock signal lines.

In an embodiment, the plurality of first through holes may not overlap the plurality of touch signal lines.

In an embodiment, the second electrode may extend toward the second conductive layer and the second electrode and the second conductive layer may be connected to each other.

In an embodiment, the second electrode may be spaced apart from the second conductive layer.

In an embodiment, a constant voltage may be provided to the conductive portion.

According to another aspect of the invention, a display device includes a base layer, a circuit layer disposed on the base layer including a pixel circuit layer and a driving circuit layer configured to provide a signal for driving the pixel circuit layer and including a plurality of clock signal lines, an organic light emitting diodes disposed on the circuit layer and including a first electrode electrically connected to the pixel circuit layer, an organic light emitting layer disposed on the first electrode, and a second electrode disposed on the organic light emitting layer; a thin film sealing layer disposed on the organic light emitting diode, a touch detection unit directly disposed on the thin film sealing layer and including a touch detection part and a plurality of touch signal lines electrically connected to the touch detection part, and a conductive portion disposed between the plurality of clock signal lines and the plurality of touch signal lines.

In an embodiment, the conductive portion may include a first conductive layer disposed on the same layer as the first electrode and having a plurality of first through holes defined therethrough and a second conductive layer disposed on the same layer as the second electrode.

In an embodiment, the second conductive layer may overlap the plurality of first through holes.

In an embodiment, the plurality of first through holes may not overlap the plurality of clock signal lines.

In an embodiment, the plurality of first through holes may not overlap the plurality of touch signal lines.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1A:
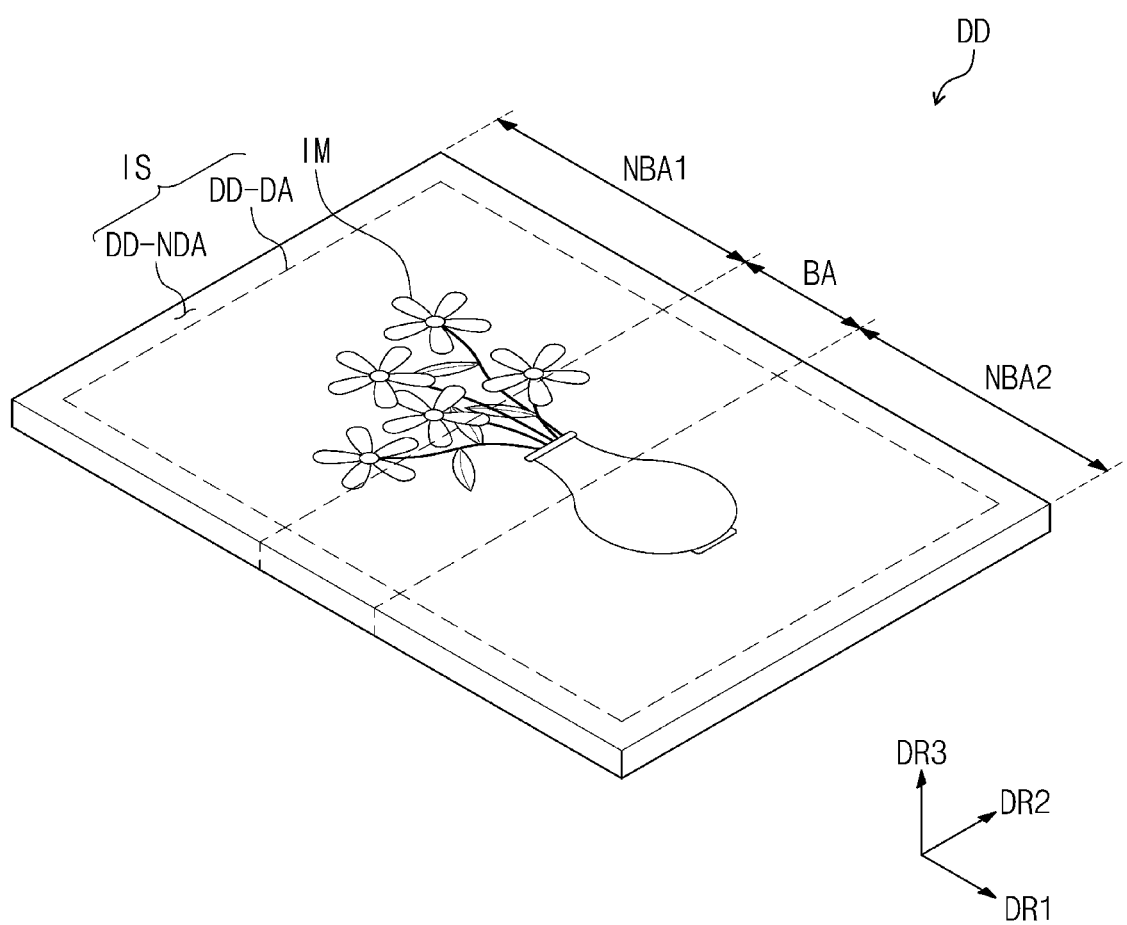
FIG. 1A is a perspective view of a first position of a first embodiment of a display device DD constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As shown in FIG. 1A, in a first operating mode of display device DD, a display surface IS where an image IM is displayed is a surface extending in a first direction DR1 and a second direction DR2. The display surface IS has a thickness in a third direction DR3 normal to the first two directions. The front surface (or an upper surface) and the rear surface (or a lower surface) of each member are separated in the third direction DR3. However, the directions that the first to third directions DR1, DR2, and DR3 indicate may be rearranged or redefined as they are relative. Hereinafter, first to third directions as directions that the respective first to third directions DR1, DR2, and DR3 indicate will be referred to by the same reference numerals.

FIGS. 1A to 1C and 3A to 4B illustrate a flexible foldable display device as one example of the display device DD. However, the inventive concepts may relate to a rollable display device or a bended display device and are not particularly limited. Additionally, although a flexible display device is shown in these embodiments, the inventive concepts are not limited thereto. The display device DD may be a flat rigid display device or a bent rigid display device. The display device DD may be used for small and medium-sized electronic devices such as mobile phones, tablets, car navigations, game consoles, and smart watches in addition to large-sized electronic devices such as televisions and monitors.

As shown in FIG. 1A, the display surface IS of the display device DD may include a plurality of areas. The display device DD may include a display area DD-DA where an image IM is displayed and a non-display area DD-NDA adjacent to the display area DD-DA. The non-display area DD-NDA may be an area where no image is displayed. FIG. 1A illustrates a vase as one example of the image IM. The display area DD-DA may have a rectangular form as shown. The non-display area DD-NDA may surround the display area DD-DA. However, the inventive concepts are not limited thereto, and a form or shape of the display area DD-DA and the non-display area DD-NDA may vary in other embodiments.

Figure 1B:
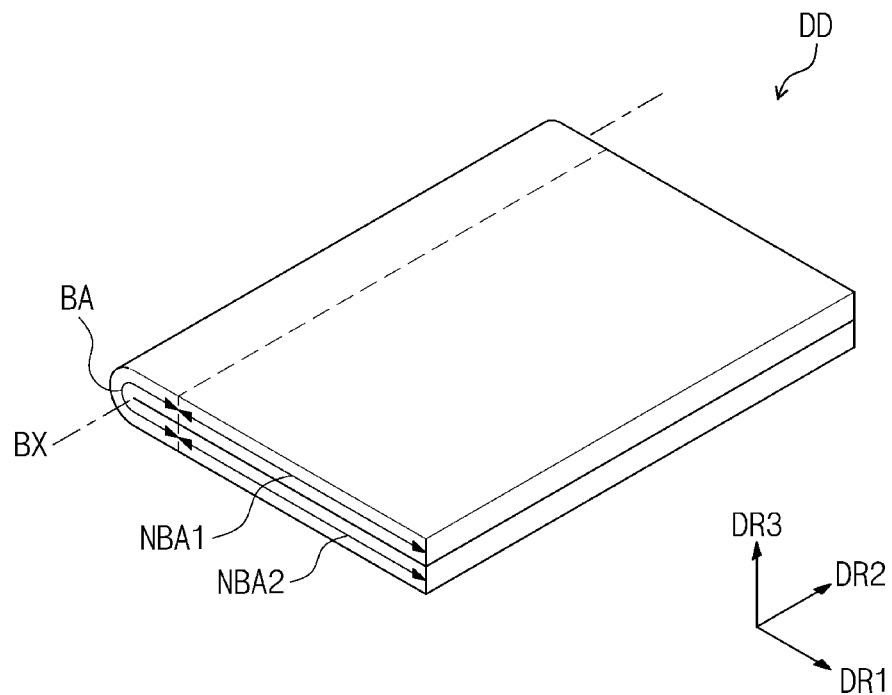
FIG. 1B is a perspective view of a second position of the display device of FIG. 1A.
Figure 1C:
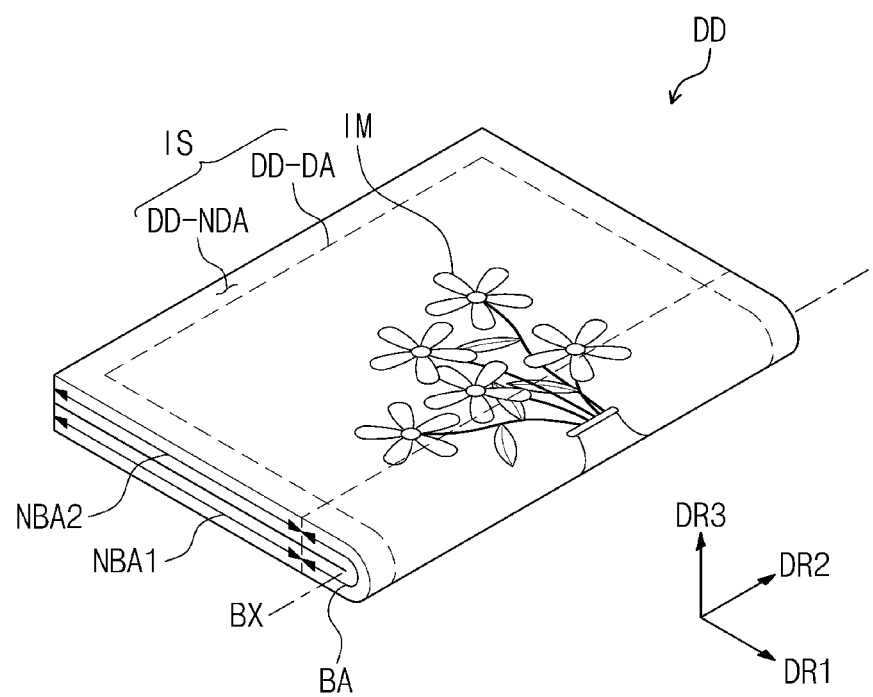
FIG. 1C is a perspective view of a third position of the display device of FIG. 1A.

As shown in FIGS. 1A to 1C, the display device DD may include a plurality of areas defined according to an operation form. The display device DD may include a bending area BA that bends around a bending axis BX, a first non-bending area NBA1, and a second non-bending area NBA2.

As shown in FIG. 1B, the display device DD may bend inwardly to allow a display surface IS of the first non-bending area NBA1 and a display surface IS of the second non-bending area NBA2 to face each other. As shown in FIG. 1C, the display device DD may bend outwardly to allow the display surface IS to be exposed to the outside.

Although only one bending area BA is shown in FIGS. 1A to 1C, the inventive concepts are not limited thereto. For example, according to an embodiment of the inventive concept, the display device DD may include a plurality of bending areas BA.

According to an embodiment of the inventive concepts, the display device DD may be configured to repeat only the operating mode shown in FIGS. 1A and 1B. However, the inventive concepts are not limited thereto, and the bending area BA may be defined as being where a user manipulates the display device DD. For example, unlike FIGS. 1B and 1C, the bending area BA may be defined parallel to the first direction DR1 and may be defined in a diagonal direction. An area of the bending area BA is not fixed and may be determined according to the radius of curvature.

Figure 2:
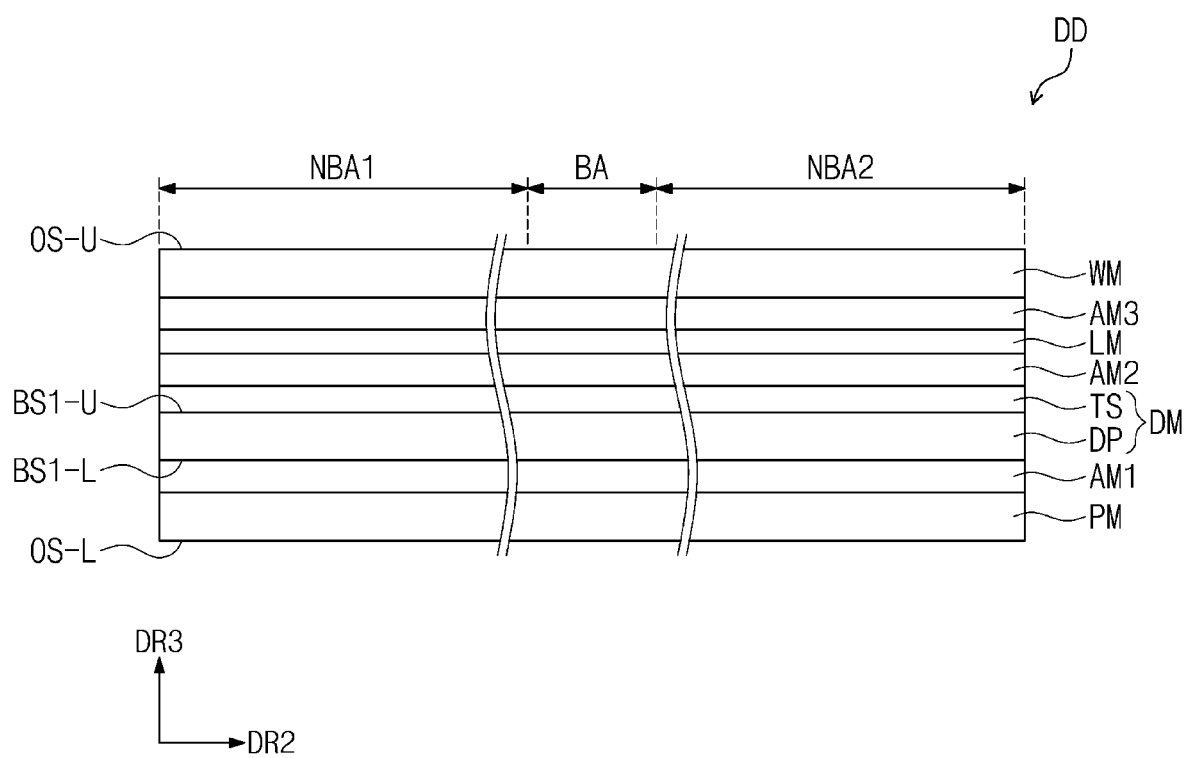
FIG. 2 is a cross-sectional side view of the display device of FIG. 1A.

FIG. 2 shows a sectional view of a cross-section taken in a plane of the second direction DR2 and the third direction DR3.

As shown in FIG. 2, the display device DD includes a protective film PM, a display module DM, an optical member LM, a window WM, a first adhesive member AM1, a second adhesive member AM2, and a third adhesive member AM3. The display module DM is disposed between the protective film PM and the optical member LM. The optical member LM is disposed between the display module DM and the window WM. The first adhesive member AM1 bonds the display module DM and the protective film PM; the second adhesive member AM2 bonds the display module DM and the optical member LM; and, the third adhesive member AM3 bonds the optical member LM and the window WM.

The protective film PM protects the display module DM. The protective film PM provides a first outer surface OS-L exposed to the outside and provides an adhesive surface adhering to the first adhesive member AM1. The protective film PM prevents external moisture from penetrating the display module DM and absorbs forces from an external impact.

The protective film PM may include a plastic film as a base substrate. The protective film PM may include a plastic film including one selected from the group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), and a combination thereof.

The material constituting the protective film PM is not limited to plastic resins and may include an organic/inorganic composite material. The protective film PM may include an inorganic material filled in the pores of a porous organic layer and the organic layer. The protective film PM may further include a functional layer formed at a plastic film. The functional layer may include a resin layer. The functional layer may be formed through a coating method. The protective film PM may also be omitted.

The window WM may protect the display module DM from damage caused by an external impact and provide an input surface to a user. The window WM provides a second outer surface OS-U exposed to the outside and provides an adhesive surface adhering to the second adhesive member AM2. The display surface IS shown in FIGS. 1A to 1C may be the second outer surface OS-U.

The window WM may include a plastic film. The window WM may have a multilayer structure. The window WM may have a multilayer structure selected from a glass substrate, a plastic film, and a plastic substrate. The window WM may further include a bezel pattern. The multilayer structure may be formed through a continuous process or an adhering process using an adhesive layer.

The optical member LM reduces an external light reflectance. The optical member LM may include at least a polarizing film. The optical member LM may further include a phase difference film. According to an embodiment of the inventive concept, the optical member LM may be omitted.

The display module DM may include an organic light emitting display panel (or a display panel) DP and a touch detection unit TS. The touch detection unit TS may be directly disposed on the organic light emitting display panel DP. In this specification, "directly disposed" means "being formed" through a continuous process, excluding "attached" through an additional adhesive layer.

The organic light emitting display panel DP generates the image IM (see FIG. 1A) corresponding to inputted image data. The organic light emitting display panel DP provides a first display panel surface BS1-L and a second display panel surface BS1-U facing in third direction DR3. In this embodiment, although an organic light emitting display panel DP is described exemplarily, the display panel is not limited thereto.

The touch detection unit TS obtains coordinate information of an external input. The touch detection unit TS may detect an external input through a capacitance method.

The display module DM according to an embodiment of the inventive concept may further include an anti-reflective layer (not shown). The anti-reflective layer may include a color filter or a layer-stacked structure of conductive layer/insulation layer/conductive layer. The anti-reflective layer may reduce an external light reflectance by absorbing, destructive-interfering, or polarizing the light incident from the outside. The anti-reflective layer may replace a function of the optical member LM.

Each of the first adhesive member AM1, the second adhesive member AM2, and the third adhesive member AM3 may be an organic adhesive layer such as an Optically Clear Adhesive (OCA) film, Optically Clear Resin (OCR), or a Pressure Sensitive Adhesive (PSA) film. The organic adhesive layer may include an adhesive material such as a polyurethane, polyacrylic, polyester, polyepoxy, and polyvinyl acetate.

The display device DD may further include a frame structure (not shown) for supporting the functional layers in order to maintain the positions shown in FIGS. 1A to 1C. The frame structure may include an articulated structure or a hinge structure.

Figure 3A:
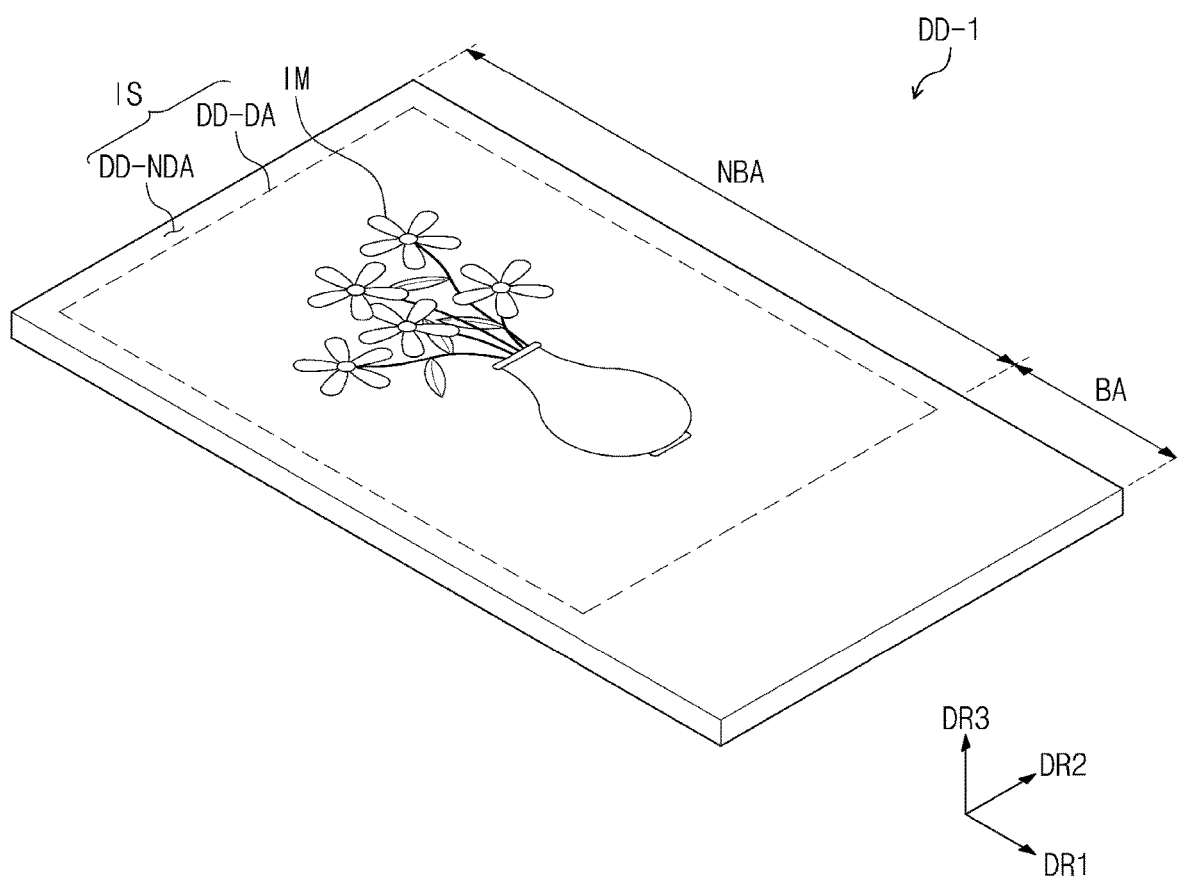
FIGS. 3A and 3B are perspective views of a second embodiment of a display device DD-1 constructed according to the principles of the invention.
Figure 3B:
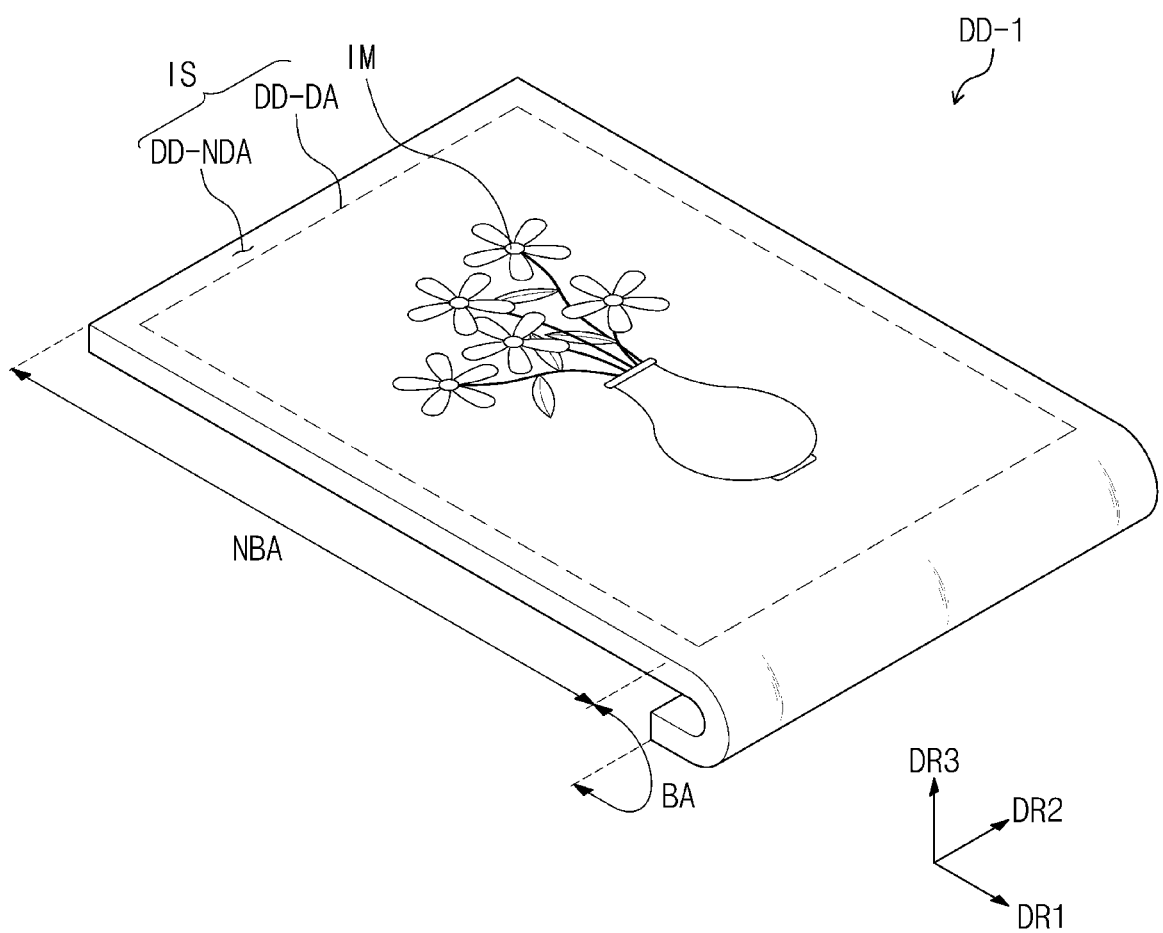

FIG. 3A shows the display device DD-1 in an unfolded state and FIG. 3B shows the display device DD-1 in a bent state.

The display device DD-1 may include one bending area BA and one non-bending area NBA. The non-display area DD-NDA of the display device DD-1 may be bendable. The bending area of the display device DD-1 may be different in other embodiments.

Unlike the display device DD shown in FIGS. 1A to 1C, the display device DD-1 may be fixed in one shape and operate. As shown in FIG. 3B, the display device DD-1 may operate in a bended state. The display device DD-1 may be fixed at a frame in a bended state and the frame may be bonded to the housing of an electronic device.

The display device DD-1 may have the same sectional structure as that shown in FIG. 2. However, the non-bending area NBA and the bending area BA may have a different layer-stacked structure. The non-bending area NBA may have the same sectional structure as that shown in FIG. 2 and the bending area BA may have a different sectional structure than that shown in FIG. 2. The optical member LM and the window WM might not be disposed in the bending area BA. For example, the optical member LM and the window WM might be disposed only in the non-bending area NBA. Similarly, the second adhesive member AM2 and the third adhesive member AM3 might also not be disposed in the bending area BA.

Figure 4A:
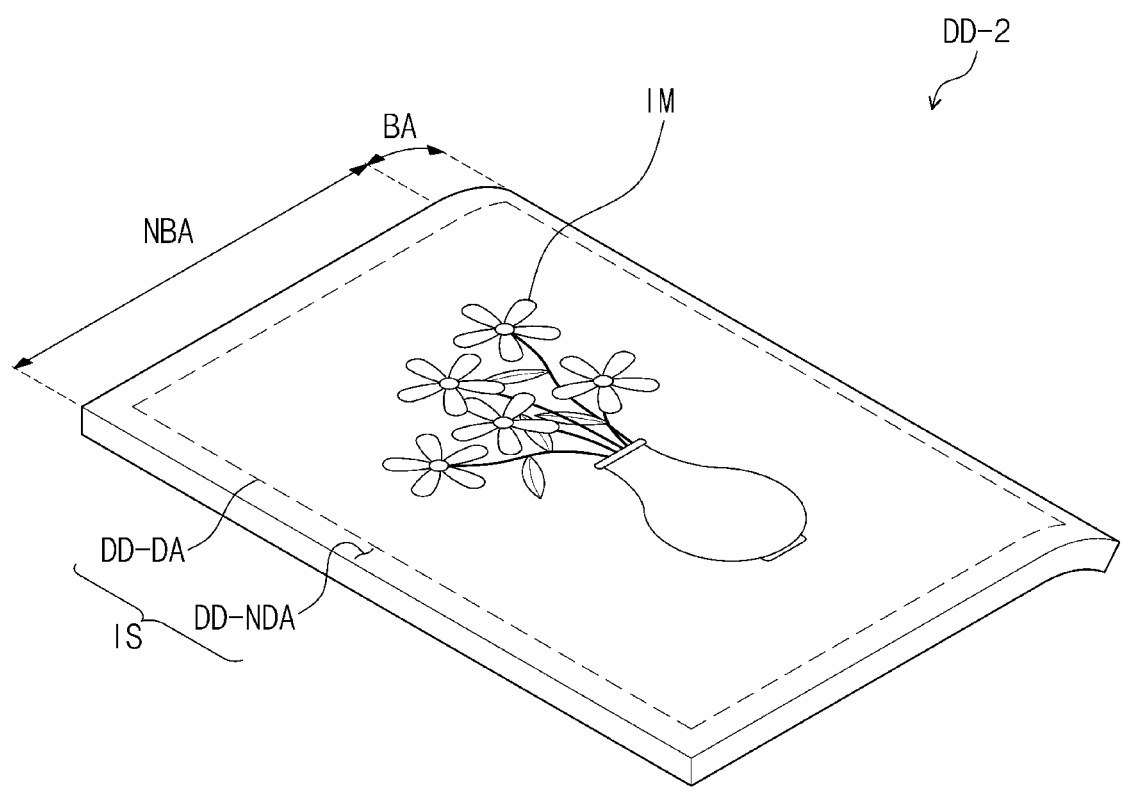
FIG. 4A is a perspective view of a third embodiment of a display device DD-2 constructed according to the principles of the invention.
Figure 4A:
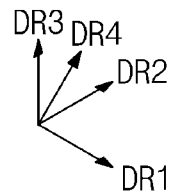
Figure 4B:
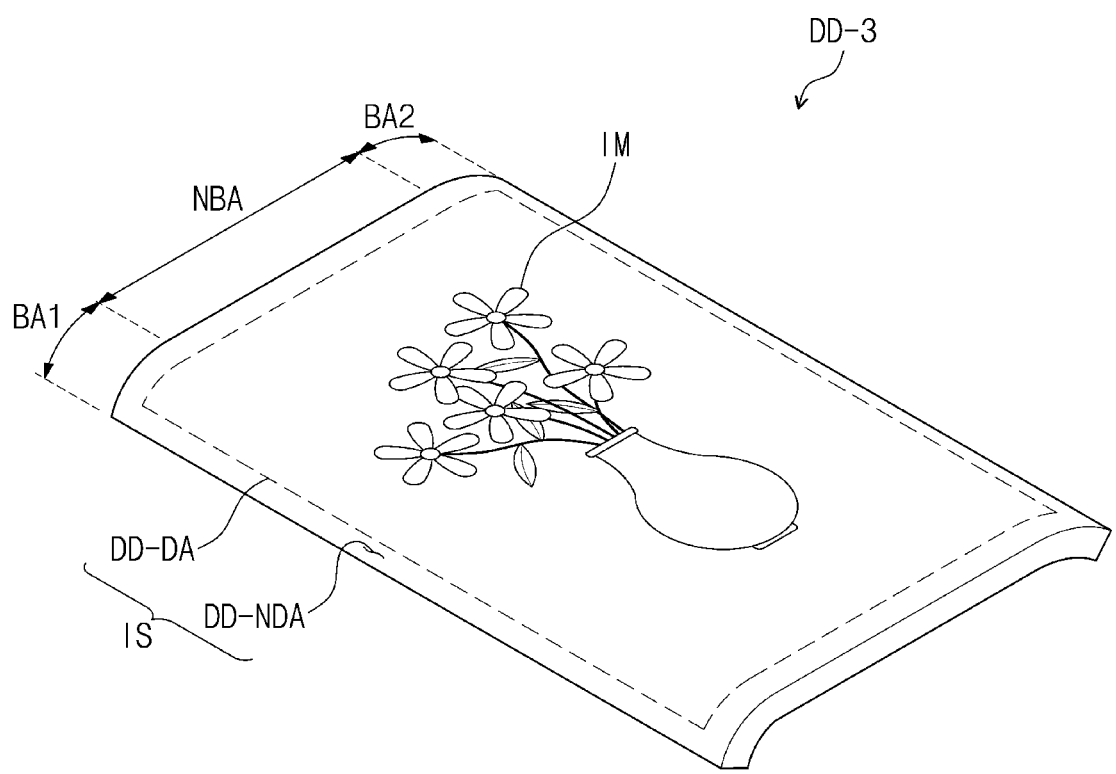
FIG. 4B is a perspective view of a fourth embodiment of a display device DD-3 constructed according to the principles of the invention.
Figure 4B:
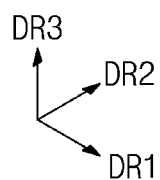

Referring now to FIG. 4A, the display device DD-2 includes a non-bending area (or a flat area) NBA where a main image is displayed on the front surface and a bending area (or a side area) BA where a sub image is displayed on a side surface. Although not shown in the drawing, the sub image may include an icon for providing predetermined information. In this embodiment, the terms "non-bending area NBA" and "bending area BA" define the display device DD-2 by using a plurality of areas divided by form or status of bending.

The bending area BA bent from the non-bending area NBA displays a sub image in a fourth direction DR4 intersecting the first direction DR1, the second direction DR2, and the third direction DR3. However, other relative directions may also be used, Referring now to FIG. 4B, the display device DD-3 includes a non-bending area NBA where a main image is displayed on the front surface, and a first bending area BA1 and a second bending area BA2 where a sub image is displayed on side surfaces. The first bending area BA1 and the second bending area BA2 may be bent from opposing sides of the non-bending area NBA.

Figure 5A:
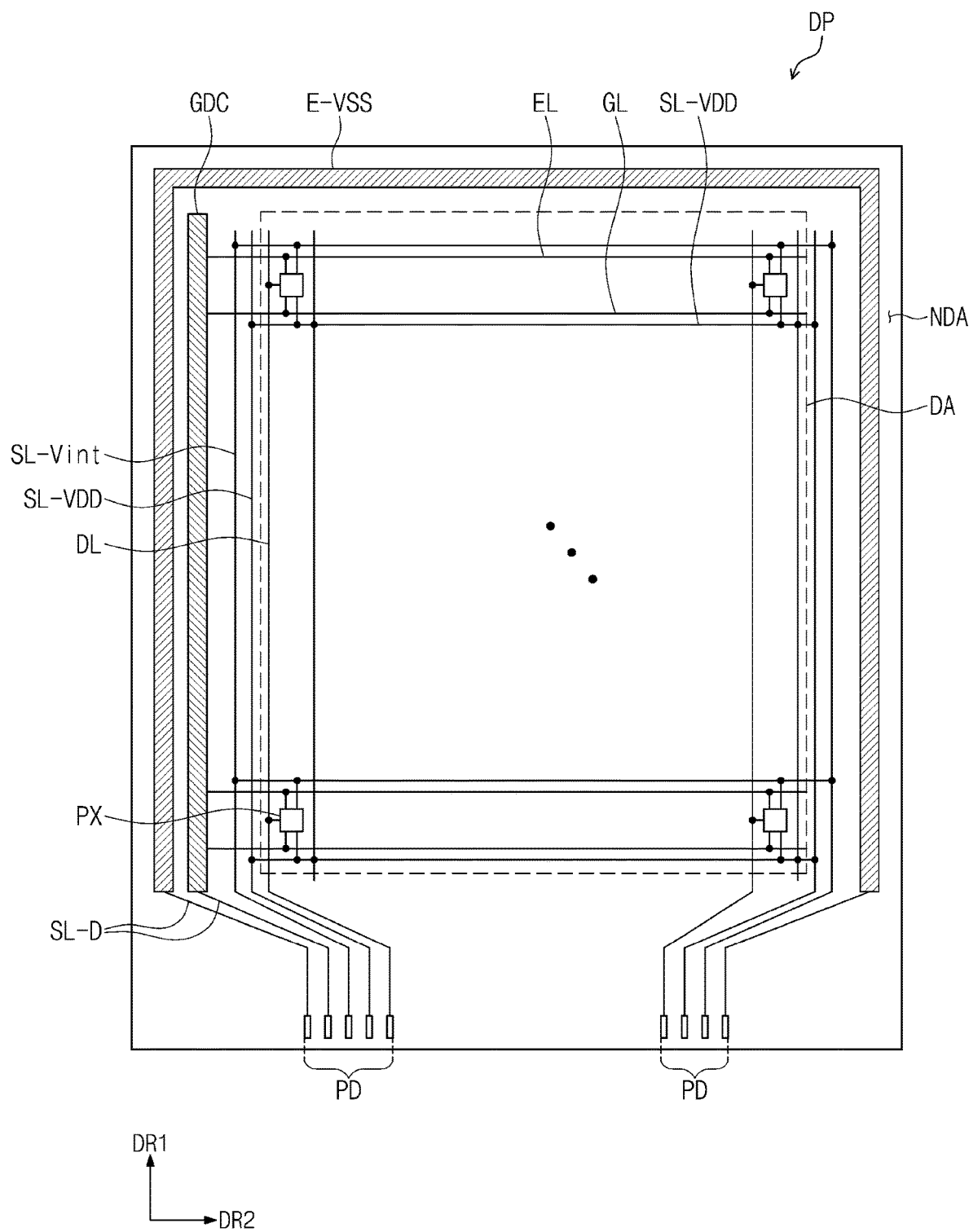
FIG. 5A is a plan view of an embodiment of an organic light emitting display panel that may be employed in display devices of the invention.

As shown in FIG. 5A, the organic light emitting display panel DP includes a display area DA and a non-display area NDA in a plane. The display area DA and the non-display area NDA of the organic light emitting display panel DP may correspond to the display area DD-DA (see FIG. 1A) and the non-display area DD-NDA (see FIG. 1A) of the display area DD (see FIG. 1A), respectively. The display area DA and the non-display area NDA of the organic light emitting display panel DP may not be necessarily identical to the display device DD-DA (see FIG. 1A) and the non-display area DD-NDA (see FIG. 1A) of the display device DD (see FIG. 1A), and may vary according to a structure/design of the organic light emitting display panel DP.

The organic light emitting display panel DP includes a plurality of pixels PX. An area where the plurality of pixels PX are disposed may be defined as the display area DA. In this embodiment, the non-display area NDA may be defined along the outline surrounding the display area DA.

The organic light emitting display panel DP includes gate lines GL, data lines DL, light emitting lines EL, a control signal line SL-D, an initialization voltage line SL-Vint, a voltage line SL-VDD, a power supply line E-VSS, and a pad part PD.

The gate lines GL are respectively connected to corresponding pixels PX among the plurality of pixels PX, and the data lines DL are respectively connected to corresponding pixels PX among the plurality of pixels PX. Each of the light emitting lines EL may be arranged parallel to a corresponding gate line GL among the gate lines GL. The control signal line SL-D may provide control signals to the gate driving circuit GDC. The initialization voltage line SL-Vint may provide initialization voltage to the plurality of pixels PX. The voltage line SL-VDD may be connected to the plurality of pixels PX and provide a first voltage to the plurality of pixels PX. The voltage line SL-VDD may include a plurality of lines extending in the first direction DR1 and a plurality of lines extending in the second direction DR2. The power supply line E-VSS may surround three sides of the display area DA and may be disposed in the non-display area NDA. A common voltage (for example, a second voltage) may be provided to a plurality of pixels PX of the power supply line E-VSS. The common voltage may have a lower level voltage than the first voltage.

The gate driving circuit GDC where the gate lines GL and the light emitting lines EL are connected may be disposed at one side of the non-display area NDA. Some of the gate lines GL, the data lines DL, the light emitting lines EL, the control signal line SL-D, the initialization voltage line SL-Vint, the voltage line SL-VDD, and the power supply line E-VSS are disposed at the same layer and some of them are disposed at another layer.

The pad part PD may be connected to the ends of the data lines DL, the control signal line SL-D, the initialization voltage line SL-Vint, and the voltage line SL-VDD.

Figure 5B:
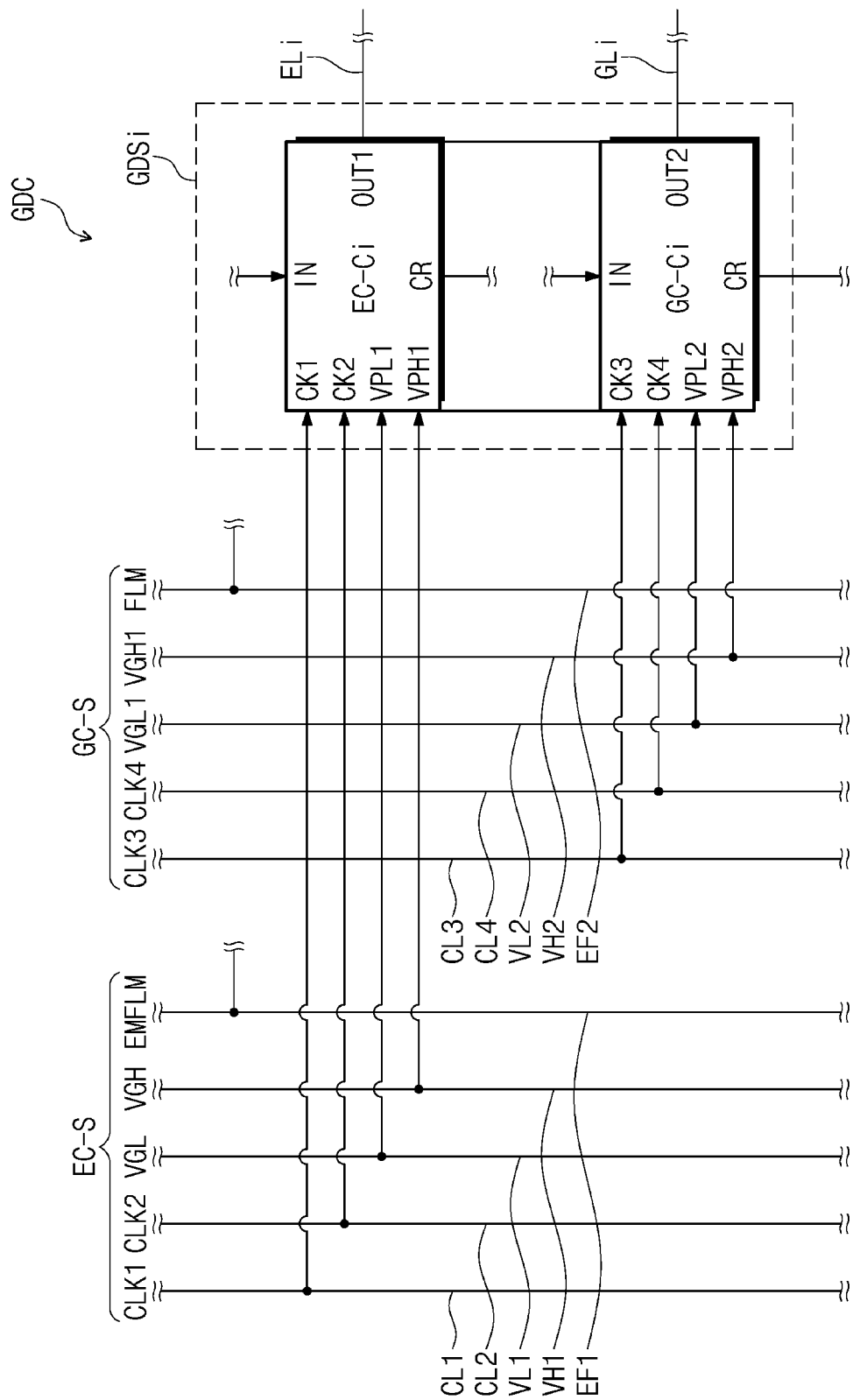
FIG. 5B is a block diagram of an embodiment of a driving stage of a gate driving circuit that may be employed in display devices of the invention.

FIG. 5B shows an example of a driving stage GDSi connected to an ith gate line GLi and an ith light emitting line ELi among driving stages of a plurality of gate driving circuits GDC.

The driving stage GDSi may include a light emitting control stage EC-Ci and a gate driving stage GC-Ci. Light emitting control signals CLK1, CLK2, VGL, VGH, and EMFLM may be provided to the light emitting control stage EC-Ci of the driving stage GDSi through a first clock signal line CL1, a second clock signal line CL2, a first voltage line VL1, a second voltage line VH1, and a first start signal line EF1. Gate control signals CLK3, CLK4, VGH1, VGL1, and FLM may be provided to the gate driving stage GC-Ci through a third clock signal line CL3, a fourth clock signal line CL4, a third voltage line VL2, a fourth voltage line VH2, and a second start signal line EF2.

Although the light emitting control stage EC-Ci and the gate driving stage GC-Ci are included in one driving stage GDSi as depicted, the inventive concepts are not limited thereto. For example, the light emitting control stage EC-Ci and the gate driving stage GC-Ci may be included in another driving stage.

The light emitting control stage EC-Ci may include a first clock terminal CK1, a second clock terminal CK2, a first voltage input terminal VPL1, a second voltage input terminal VPH1, an input terminal IN, a carry terminal CR, and an output terminal OUT1.

The first clock terminal CK1 receives a first clock signal CLK1 and the second clock terminal CK2 receives a second clock signal CLK2. The first clock signal CLK1 and the second clock signal CLK2 may have different phases. The second clock signal CLK2 may be a signal obtained by inverting or delaying a phase of the first clock signal CLK1.

The first voltage input terminal VPL1 receives the first voltage VGL and the second voltage input terminal VPH1 receives a second voltage VGH. A voltage level of the first voltage VGL may be lower than a voltage level of the second voltage VGH.

The input terminal IN may receive a carry signal of a previous light emitting control stage EC-Ci−1 (not shown) and the carry terminal CR may output a carry signal of the next light emitting control stage EC-Ci+1 (not shown). The output terminal OUT1 may provide a light emitting control signal, which is generated from the light emitting control stage EC-Ci, to the light emitting line ELi.

The start signal EMFLM may be inputted to the input terminal IN of the first light emitting control stage EC-C1 (not shown) among the light emitting control stages.

The gate driving stage GC-Ci may include a third clock terminal CK3, a fourth clock terminal CK4, a third voltage input terminal VPL2, a fourth voltage input terminal VPH2, an input terminal IN, a carry terminal CR, and an output terminal OUT2.

The third clock terminal CK3 receives a third clock signal CLK3 and the fourth clock terminal CK4 receives a fourth clock signal CLK4. The third clock signal CLK3 and the fourth clock signal CLK4 may have different phases. The fourth clock signal CLK4 may be a signal obtained by inverting or delaying a phase of the third clock signal CLK3.

The third voltage input terminal VPL2 receives the third voltage VGL1 and the fourth voltage input terminal VPH2 receives a fourth voltage VGH1. A voltage level of the third voltage VGL1 may be lower than a voltage level of the fourth voltage VGH1.

The input terminal IN may receive a carry signal of a previous gate driving stage GC-Ci−1 (not shown) and the carry terminal CR may output a carry signal of the next gate driving stage GC-Ci+1 (not shown). The output terminal OUT2 may provide a gate signal, which is generated from the gate driving stage GC-Ci, to the gate line GLi.

The start signal FLM may be inputted to the input terminal IN of the first gate driving stage GC-C1 (not shown) among the gate driving stages.

According to an embodiment of the inventive concepts, one of the first clock terminal CK1, the second clock terminal CK2, the first voltage input terminal VPL1, the second voltage input terminal VPH1, the input terminal IN, the carry terminal CR, and the output terminal OUT1 of the light emitting control stage EC-Ci may be omitted or other terminals may be further included. For example, the carry terminal CR may be omitted.

According to an embodiment of the inventive concepts, one of the third clock terminal CK3, the fourth clock terminal CK4, the third voltage input terminal VPL2, the fourth voltage input terminal VPH2, the input terminal IN, the carry terminal CR, and the output terminal OUT2 of the gate driving stage GC-Ci may be omitted or other terminals may be further included. For example, the carry terminal CR may be omitted.

Additionally, although it is exemplarily shown that the input terminal IN of the light emitting control stage EC-Ci and the input terminal IN of the gate driving stage GC-Ci are respectively connected to the carry terminals of a previous stage, the inventive concepts are not limited thereto. The connection between driving stages may be changed variously in other embodiments.

Figure 5C:
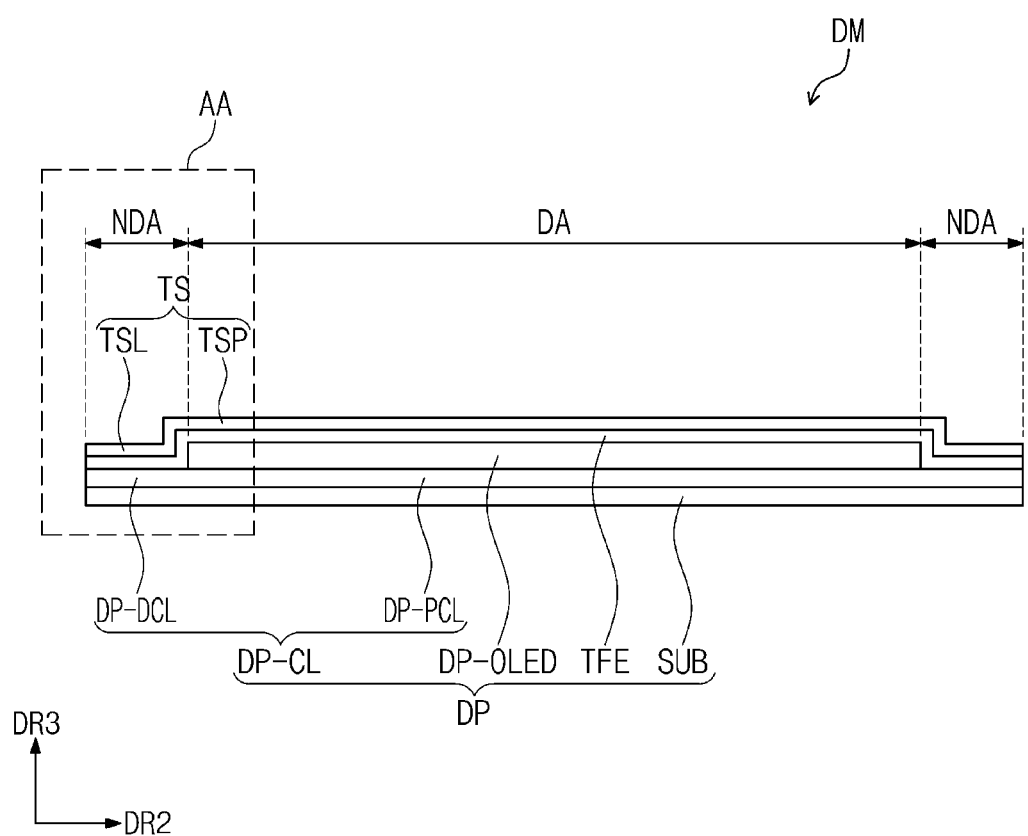
FIG. 5C is a schematic cross-sectional side view of an embodiment of a display module that may be employed in display devices of the invention.

As shown in FIG. 5C, the organic light emitting display panel DP includes a base layer SUB, a circuit layer DP-CL disposed on the base layer SUB, a light emitting element layer DP-OLED, and a thin film sealing layer TFE.

The base layer SUB may include a plastic substrate as a flexible substrate, a glass substrate, a metal substrate, or an organic/inorganic composite material substrate. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, and perylene resin.

The circuit layer DP-CL may include a plurality of insulation layers, a plurality of conductive layers, and a semiconductor layer. The plurality of conductive layers of the circuit layer DP-CL may constitute signal lines or a control circuit of a pixel. The circuit layer DP-CL may include a pixel circuit layer DP-PCL disposed in the display area DA and a driving circuit layer DP-DCL disposed in the non-display area NDA. The pixel circuit layer DP-PCL may include circuits having the gate lines GL, the data lines DL, the light emitting lines EL, the initialization voltage line SL-Vint, the voltage line SL-VDD, and the pixels PX described above with reference to FIG. 5A.

The driving circuit layer DP-DCL may include the gate driving circuit GDC and the control signal line SL-D described above with reference to FIG. 5A. The control signal line SL-D may include the first clock signal line CL1, the second clock signal line CL2, the third clock signal line CL3, the fourth clock signal line CL4, the first voltage line VL1, the second voltage line VH1, the third voltage line VL2, the fourth voltage line VH2, the first start signal line EF1, and the second start signal line EF2 shown in FIG. 5B. The first clock signal line CL1, the second clock signal line CL2, the third clock signal line CL3, and the fourth clock signal line CL4 may be collectively referred to as clock signal lines.

The light emitting element layer DP-OLED includes organic light emitting diodes and a pixel definition layer.

The thin film sealing layer TFE seals the light emitting element layer DP-OLED. The thin film sealing layer TFE may include at least two inorganic layers and an organic layer therebetween. The inorganic layers protect the light emitting element layer DP-OLED from moisture and oxygen and the organic thin film protects the light emitting element layer DP-OLED from a foreign material such as dust particles.

The touch detection unit TS is disposed on the thin film sealing layer TFE. The touch detection unit TS may be directly disposed on the thin film sealing layer TFE. However, the inventive concepts are not limited thereto, and a buffer layer may be disposed on the thin film sealing layer TFE and the touch detection unit TS may be directly disposed on the buffer layer. The buffer layer may be an inorganic layer or an organic layer. The inorganic layer may include at least one of a silicon nitride, a silicon oxynitride, a silicon oxide, a titanium oxide, or an aluminum oxide. The organic layer may include a polymer (for example, acrylic-based) organic layer. However, this is exemplary and the inventive concepts are not limited thereto. Although it is described that the buffer layer is a separate component, the buffer layer may be a component included in the thin film sealing layer TFE.

The touch detection unit TS includes a touch detection part TSP and touch signal lines TSL. The touch detection part TSP and the touch signal lines TSL may have a single or multi-layer structure. The touch detection part TSP and the touch signal lines TSL may include indium tin oxide (ITO), indium zinc oxide (IZO), zinc oxide (ZnO), indium tin zinc oxide (ITZO), PEDOT, metal nano wire, and graphene. The touch detection part TSP and the touch signal lines TSL may include a metal layer, for example, molybdenum, silver, titanium, copper, aluminum, or alloys thereof. The touch detection part TSP and the touch signal lines TSL may have the same or different layer structure. Specific contents on the touch detection unit TS will be described later.

Figure 6A:
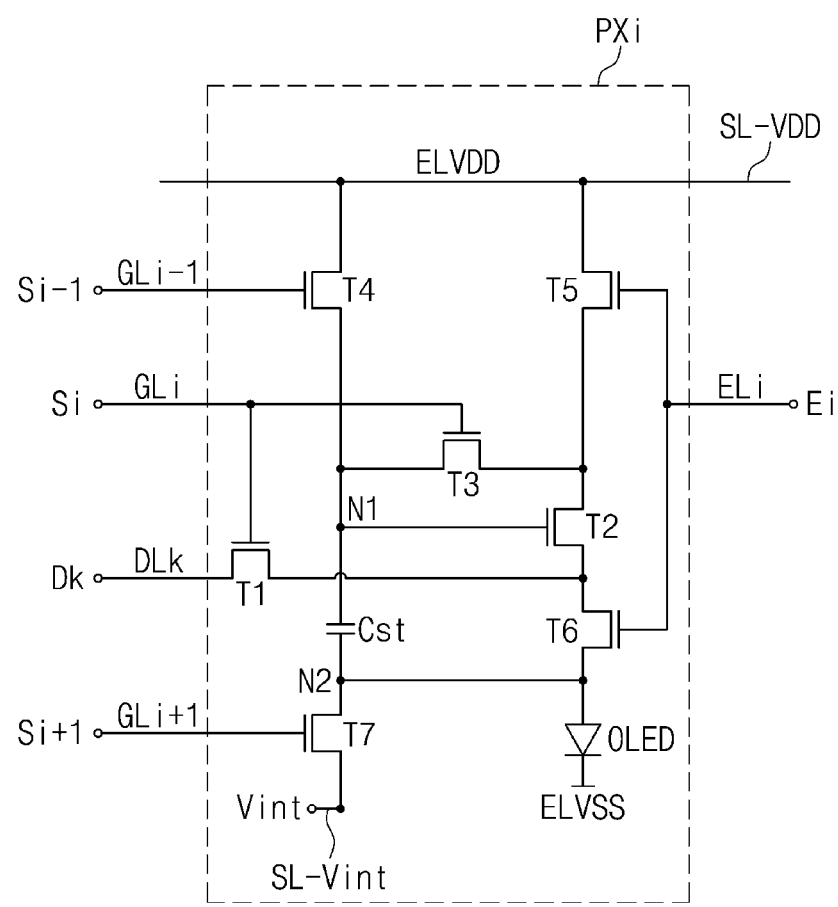
FIG. 6A is an equivalent circuit diagram of an embodiment of a pixel that may be employed in display devices of the invention.

FIG. 6A shows an example of how the ith pixel PXi may be connected to the kth data line DLk among the plurality of data lines DL (see FIG. 5A).

The ith pixel PXi includes an organic light emitting diode OLED and a pixel driving circuit for controlling the organic light emitting diode. The pixel driving circuit may include seven thin film transistors T1 to T7 and one capacitor Cst.

The driving transistor controls a driving current supplied to the organic light emitting diode OLED. The output electrode of the second transistor T2 is electrically connected to the organic light emitting diode OLED. The output electrode of the second transistor T2 may directly contact the first electrode of the organic light emitting diode OLED or may be connected to it through another transistor (for example, the sixth transistor T6 in this embodiment).

The control electrode of the control transistor may receive a control signal. A control signal applied to the ith pixel PXi may include the i−1th gate signal Si−1, the ith gate signal Si, the i+1th gate signal Si+1, a data signal DK, and the ith light emitting control signal Ei. According to an embodiment of the inventive concept, the control transistor may include the first transistor T1 and the third to seventh transistors T3 to T7.

The first transistor T1 includes an input electrode connected to the kth gate line DLk, a control electrode connected to the ith gate line GLi, and an output electrode connected to the output electrode of the second transistor T2. The first transistor T1 is turned on by the gate signal Si (hereinafter referred to as the ith gate signal) applied to the ith gate line GLi, and provides a data signal Dk applied to the kth data line DLk to the capacitor Cst.

Figure 6B:
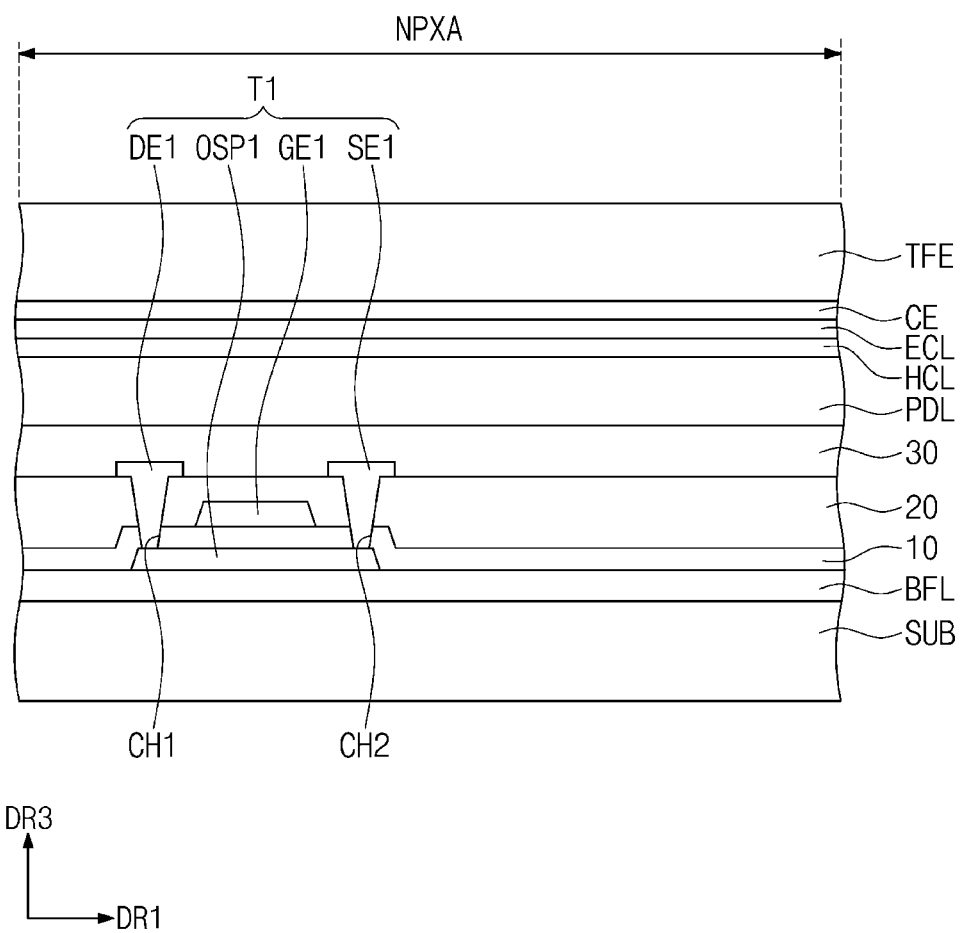
FIG. 6B is a fragmented cross-sectional side view of an embodiment of an organic light emitting display panel that may be employed in display devices of the invention.
Figure 6C:
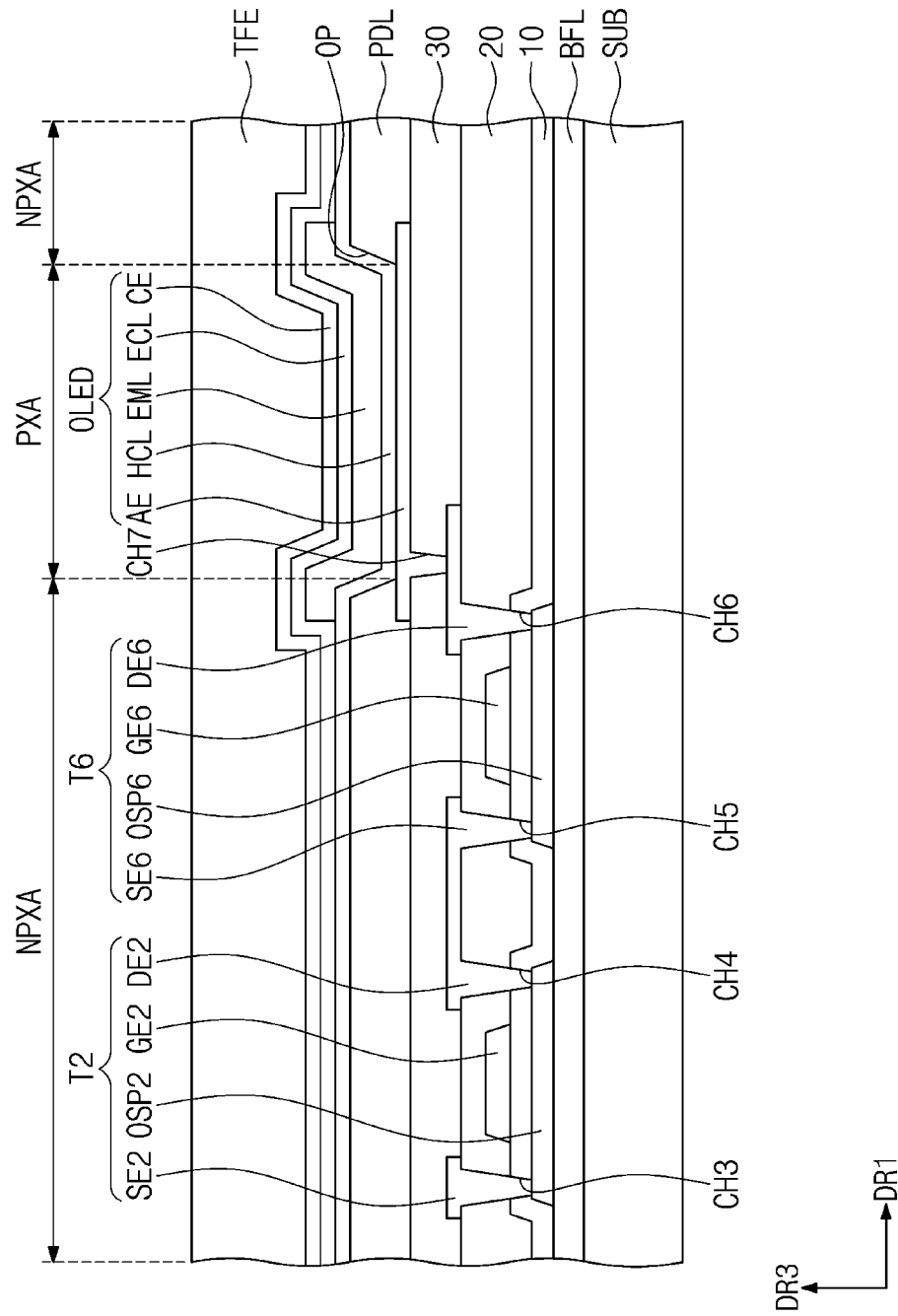
FIG. 6C is a fragmented cross-sectional side view of an embodiment of an organic light emitting display panel that may be employed in display devices of the invention.

FIG. 6B is a sectional view of the first transistor T1 of the equivalent circuit shown in FIG. 6A. FIG. 6C is a sectional view of the second transistor T2, the sixth transistor T6, and the organic light emitting diode OLED of the equivalent circuit shown in FIG. 6A.

Referring to FIGS. 6B and 6C, a buffer layer BFL may be disposed on the base layer SUB. The buffer layer BFL improves the bonding strength of the base layer SUB and conductive patterns or semiconductor patterns. The buffer layer BFL may include an inorganic layer. Although not shown in the drawing, a barrier layer for preventing a foreign material from entering may be further disposed on an upper surface of the base layer SUB. The buffer layer BFL and the barrier layer may be selectively included or omitted in various exemplary embodiments.

A semiconductor pattern OSP1 (hereinafter referred to as a first semiconductor pattern) of the first transistor T1, a semiconductor pattern OSP2 (hereinafter referred to as a second semiconductor pattern) of the second transistor T2, and a semiconductor pattern OSP6 (hereinafter referred to as a sixth semiconductor pattern) of the sixth transistor T6 are disposed on the buffer layer BFL. The first semiconductor pattern OSP1, the second semiconductor pattern OSP2, and the sixth semiconductor pattern OSP6 may be fabricated of a material selected from amorphous silicon, polysilicon, and metal oxide semiconductors.

A first insulation layer 10 may be disposed on the first semiconductor pattern OSP1, the second semiconductor pattern OSP2, and the sixth semiconductor pattern OSP6. Although it is shown in FIGS. 6B and 6C that the first insulation layer 10 is provided as an unpatterned layer for covering the first semiconductor pattern OSP1, the second semiconductor pattern OSP2, and the sixth semiconductor pattern OSP6, the first insulation layer 10 may be provided as a patterned layer corresponding to the first semiconductor pattern OSP1, the second semiconductor pattern OSP2, and the sixth semiconductor pattern OSP6.

The first insulation layer 10 may include a plurality of inorganic thin films. The plurality of inorganic thin films may include a silicon nitride layer, a silicon oxynitride layer, and a silicon oxide layer.

A control electrode GE1 (hereinafter referred to as a first control electrode) of the first transistor T1, a control electrode GE2 (hereinafter referred to as a second control electrode) of the second transistor T2, and a control electrode GE6 (hereinafter referred to as a sixth control electrode) of the sixth transistor T6 are disposed on the first insulation layer 10. The first control electrode GE1, the second control electrode GE2, and the sixth control electrode GE6 may be fabricated according to the same photolithography process as the gate lines GL (see FIG. 5A).

A second insulation layer 20 for covering the first control electrode GE1, the second control electrode GE2, and the sixth control electrode GE6 may be disposed on the first insulation layer 10. The second insulation layer 20 may provide a flat upper surface. The second insulation layer 20 may include an organic material and/or an inorganic material.

An input electrode SE1 (hereinafter referred to as a first input electrode) and an output electrode DE1 (hereinafter referred to as a first output electrode) of the first transistor T1, an input electrode SE2 (hereinafter referred to as a second input electrode) and an output electrode DE2 (hereinafter referred to as a second output electrode) of the second transistor T2, and an input electrode SE6 (hereinafter referred to as a sixth input electrode) and an output electrode DE6 (hereinafter referred to as a sixth output electrode) of the sixth transistor T6 are disposed on the second insulation layer 20.

Each of the first output electrode DE1 and the first input electrode SE1 is connected to the first semiconductor pattern OSP1 through a first through hole CH1 and a second through hole CH2 penetrating the first insulation layer 10 and the second insulation layer 20. Each of the second input electrode SE2 and the second output electrode DE2 is connected to the second semiconductor pattern OSP2 through a third through hole CH3 and a fourth through hole CH4 penetrating the first insulation layer 10 and the second insulation layer 20. Each of the sixth input electrode SE6 and the sixth output electrode DE6 is connected to the sixth semiconductor pattern OSP6 through a fifth through hole CH5 and a sixth through hole CH6 penetrating the first insulation layer 10 and the second insulation layer 20. On the other hand, according to other embodiments of the inventive concept, some of the first transistor T1, the second transistor T2, and/or the sixth transistor T6 may be modified and implemented as a bottom gate structure.

A third insulation layer 30 for covering the first input electrode SE1, the second input electrode SE2, the sixth input electrode SE6, the first output electrode DE1, the second output electrode DE2, and the sixth output electrode DE6 is disposed on the second insulation layer 20. The third insulation layer 30 may include an organic layer and/or an inorganic layer. The third insulation layer 30 may include an organic material for providing a flat surface.

In various exemplary embodiments, one or more of the first insulation layer 10, the second insulation layer 20, and the third insulation layer 30 may be omitted. Each of the second insulation layer 20 and the third insulation layer 30 may be defined as an interlayer insulation layer. The interlayer insulation layer is disposed between a conductive pattern disposed at a lower part and a conductive pattern disposed at an upper part to insulate the conductive patterns from each other.

A pixel definition layer PDL and an organic light emitting diode OLED are disposed on the third insulation layer 30. Referring to FIG. 6C, each of the organic light emitting diodes OLED may include a first electrode AE, a second electrode CE, a hole control layer HCL, an organic light emitting layer EML and an electron control layer ECL. Particularly, the first electrode AE may be disposed on the circuit layer DP-CL (see FIG. 5C). The organic light emitting layer EML may be disposed on the first electrode AE. The second electrode CE may be disposed on the organic light emitting layer EML.

A first electrode AE is disposed on the third insulation layer 30. Here, the first electrode AE may be provided as an anode or a cathode. Hereinafter, the first electrode AE is described as an anode. The first electrode AE is connected to the sixth output electrode DE6 through a seventh through hole CH7 penetrating the third insulation layer 30. An opening part OP is defined in the pixel definition layer PDL. The opening part OP of the pixel definition layer PDL exposes at least a part of the first electrode AE.

The pixel PX may be disposed in a pixel area of a plane. The pixel area may include a light emitting area PXA and a non-light emitting area NPXA adjacent to the light emitting area PXA. The non-light emitting area NPXA may surround the light emitting area PXA. According to this embodiment, the light emitting area PXA corresponds to a partial area of the first electrode AE exposed by the opening part OP.

A hole control layer HCL may be disposed in the light emitting area PXA and the non-light emitting area NPXA. Although not shown in the drawing, a common layer such as the hole control layer HCL may be formed in the plurality of pixels PX (see FIG. 5A).

An organic light emitting layer EML is disposed on the hole control layer HCL. The organic light emitting layer EML may be disposed in an area corresponding to the opening part OP. That is, the organic light emitting layer EML may be divided and formed at each of the plurality of pixels PX. With such a patterned organic light emitting layer EML as is shown in this embodiment, the organic light emitting layer EML may be disposed at the plurality of pixels PX where the organic light emitting layer EML may generate white light. Additionally, the organic light emitting layer EML may have a multilayer structure.

An electron control layer ECL is disposed on the organic light emitting layer EML. Although not shown in the drawing, the electron control layer ECL may be formed at the plurality of pixels PX (see FIG. 5A).

The second electrode CE is disposed on the electron control layer ECL at the plurality of pixels PX. Here, the second electrode CE may be provided as an anode or a cathode. Hereinafter, the second electrode CE is described as a cathode. That is, when the first electrode AE may be provided as an anode, the second electrode CE may be provided as a cathode. Also, when the first electrode AE may be provided as a cathode, the second electrode CE may be provided as an anode.

A thin film sealing layer TFE is disposed on the second electrode CE. The thin film sealing layer TFE is disposed at the plurality of pixels PX. The thin film sealing layer TFE includes at least one inorganic layer and at least one organic layer. The thin film sealing layer TFE may include a plurality of inorganic layers and a plurality of organic layers, which are stacked alternately.

In the exemplary embodiment shown, the thin film sealing layer TFE directly covers the second electrode CE. A capping layer for covering the second electrode CE may be further disposed between the thin film sealing layer TFE and the second electrode CE. The thin film sealing layer TFE may directly cover the capping layer.

Hereinafter, the thin film sealing layers TFE1, TFE2, and TFE3 are described with reference to FIGS. 7A to 7C.

Figure 7A:
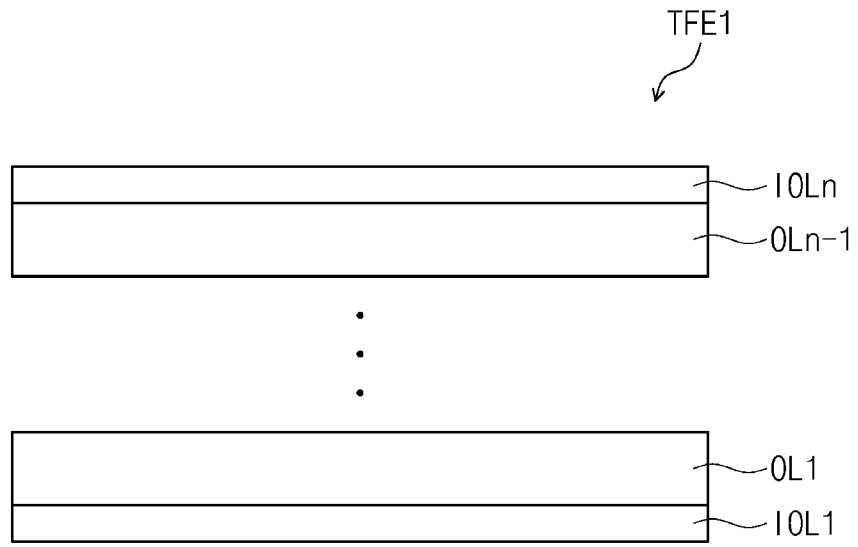
FIGS. 7A to 7C are cross-sectional side views of embodiments of thin film sealing layers that may be employed in display devices of the invention.

As shown in FIG. 7A, the thin film sealing layer TFE1 may include n inorganic thin film layers IOL1 to IOLn as the first inorganic thin film IOL1 contacting the second electrode CE (see FIG. 6C). The first inorganic thin film IOL1 may be defined as a lower inorganic thin film and inorganic thin films other than the first inorganic thin film IOL1 among the n inorganic thin films IOL1 to IOLn may be defined as upper inorganic thin films.

The thin film sealing layer TFE1 may include n−1 organic thin films OL1 to OLn−1 and the n−1 organic thin films OL1 to OLn−1 and the n inorganic thin films IOL1 to IOLn may be disposed alternately. The n−1 organic thin films OL1 to OLn−1 may have a greater thickness than the n inorganic thin films IOL1 to IOLn on average.

Each of the n inorganic thin films IOL1 to IOLn may be a single layer including one material or a multilayer including each different material. Each of the n−1 organic thin films OL1 to OLn−1 may be formed by depositing or printing organic monomers. For example, each of the n−1 organic thin films OL1 to OLn−1 may be formed using an inkjet printing method or may be formed by coating a composition containing an acrylic monomer. According to an embodiment of the inventive concept, the thin film sealing layer TFE1 may further include an nth organic thin film.

Figure 7B:
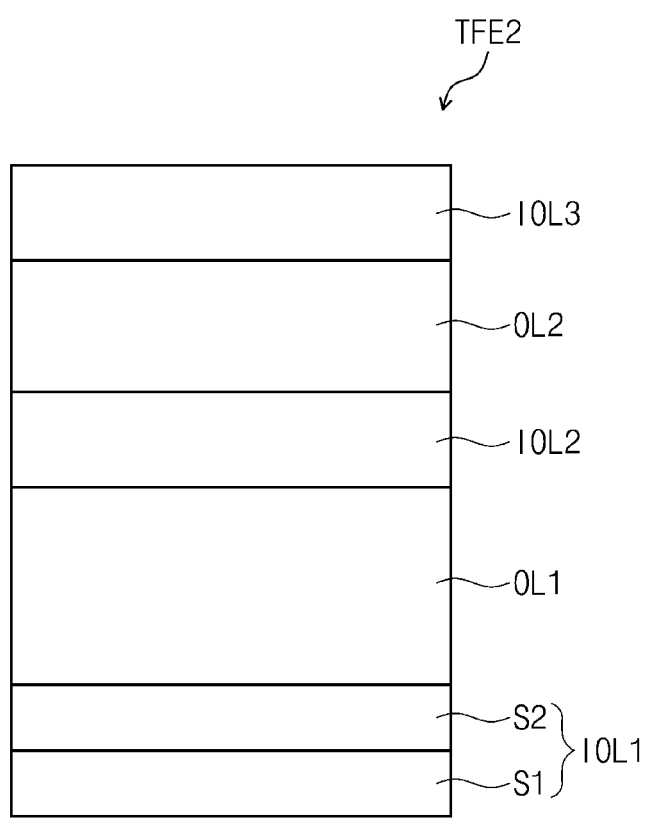
Figure 7C:
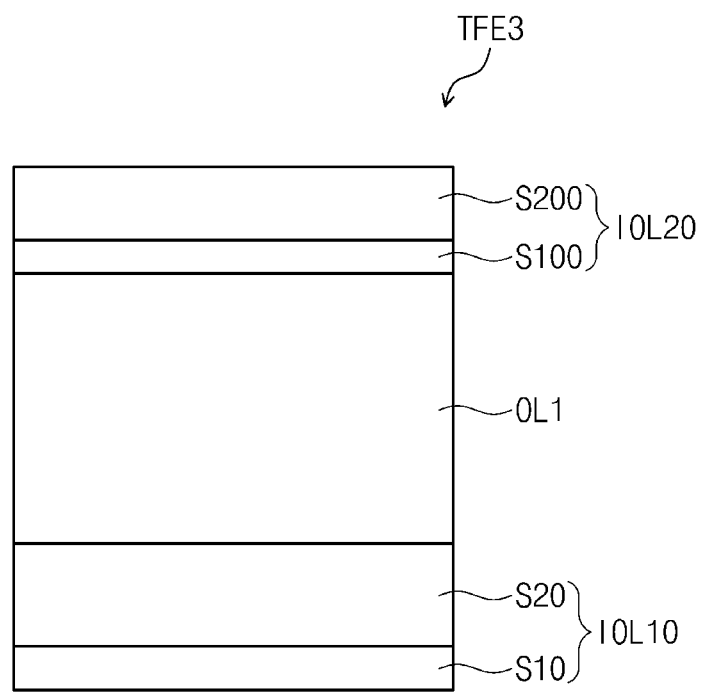

As shown in FIGS. 7B and 7C, inorganic thin films included in each of the thin film sealing layers TFE2 and TFE3 may have the same or different inorganic materials, and may have the same or different thicknesses. Organic thin films included in each of the thin film sealing layers TFE2 and TFE3 may have the same or different organic materials, and may have the same or different thicknesses.

As shown in FIG. 7B, the thin film sealing layer TFE2 may include a first inorganic thin film IOL1, a first organic thin film OL1, a second inorganic thin film IOL2, a second organic thin film OL2, and a third inorganic thin film IOL3, which are sequentially stacked.

The first inorganic thin film IOL1 may have a two-layer structure. A first sub layer S1 and a second sub layer S2 may include different inorganic materials.

As shown in FIG. 7C, the thin film sealing layer TFE3 may include a first inorganic thin film IOL10, a first organic thin film OL1, and a second inorganic thin film IOL20, which are sequentially stacked. The first inorganic thin film IOL10 may have a two-layer structure. A first sub layer S10 and a second sub layer S20 may include different inorganic materials. The second inorganic thin film IOL20 may have a two-layer structure. The second inorganic thin film IOL20 may include a first sub layer S100 and a second sub layer S200, which are deposited in different deposition environments and/or stages. The first sub layer S100 may be deposited under the low power condition and the second sub layer S200 may be deposited under the high power condition. The first sub layer S100 and the second sub layer S200 may include the same inorganic material.

Figure 8A:
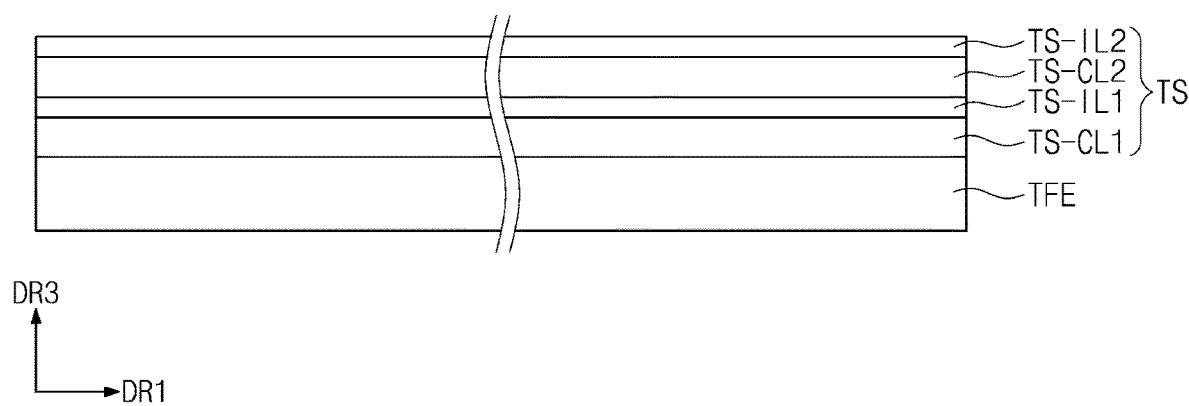
FIG. 8A is a broken cross-sectional side view of an embodiment of a touch detection unit that may be employed in display devices of the invention.

As shown in FIG. 8A, the touch detection unit TS includes a first conductive layer TS-CL1, a first insulation layer TS-IL1 (hereinafter referred to as a first touch insulation layer), a second conductive layer TS-CL2, and a second insulation layer TS-IL2 (hereinafter referred to as a second touch insulation layer). The first conductive layer TS-CL1 is directly disposed on the thin film sealing layer TFE. The inventive concepts are not limited thereto, and another buffer layer (for example, an inorganic layer or an organic layer) may be further disposed between the first conductive layer TS-CL1 and the thin film sealing layer TFE. According to another embodiment of the inventive concept, a plastic film, a glass substrate, or a plastic substrate may be disposed between the first conductive layer TS-CL1 and the thin film sealing layer TFE.

Each of the first conductive layer TS-CL1 and the second conductive layer TS-CL2 may include a single layer structure or a multilayer structure stacked in the third direction DR3. A conductive layer of the multilayer structure may include at least two of transparent conductive layers and metal layers. A conductive layer of the multilayer structure may include metal layers with different metals. The transparent conductive layer may include indium tin oxide (ITO), indium zinc oxide (IZO), zinc oxide (ZnO), indium tin zinc oxide (ITZO), PEDOT, metal nano wire, and graphene. The metal layer may include silver, titanium, copper, aluminum, and an alloy thereof.

Each of the first conductive layer TS-CL1 and the second conductive layer TS-CL2 includes a plurality of patterns. Hereinafter, the first conductive layer TS-CL1 includes first conductive patterns and the second conductive layer TS-CL2 includes second conductive patterns. Each of the first conducive patterns and the second conducive patterns may include touch electrodes and touch signal lines.

Each of the first touch insulation layer TS-IL1 and the second touch insulation layer TS-IL2 may have a single layer or multilayer structure. Each of the first touch insulation layer TS-IL1 and the second touch insulation layer TS-IL2 may include at least one of an inorganic layer and an organic layer.

The first touch insulation layer TS-IL1 insulates a first conductive layer TS-CL1 and a second conductive layer TS-CL2, and its form is not limited to the exemplary embodiment depicted. In various exemplary embodiments, the form of the first touch insulation layer TS-IL1 may be changed. For example, the first touch insulation layer TS-IL1 may cover the thin film sealing layer TFE entirely and/or may include a plurality of insulation patterns. The plurality of insulation patterns may overlap first connection parts CP1 and may overlap the second connection parts CP2 which will be described later.

Although an exemplary embodiment of the double-layer touch detection unit is shown, the inventive concepts are not limited to this embodiment. A single-layer touch detection unit includes a conductive layer and an insulation layer for covering the conductive layer. The conductive layer includes touch sensors and touch signal lines connected to the touch sensors. The single-layer touch detection unit may obtain coordinate information through a self-cap method.

Figure 8B:
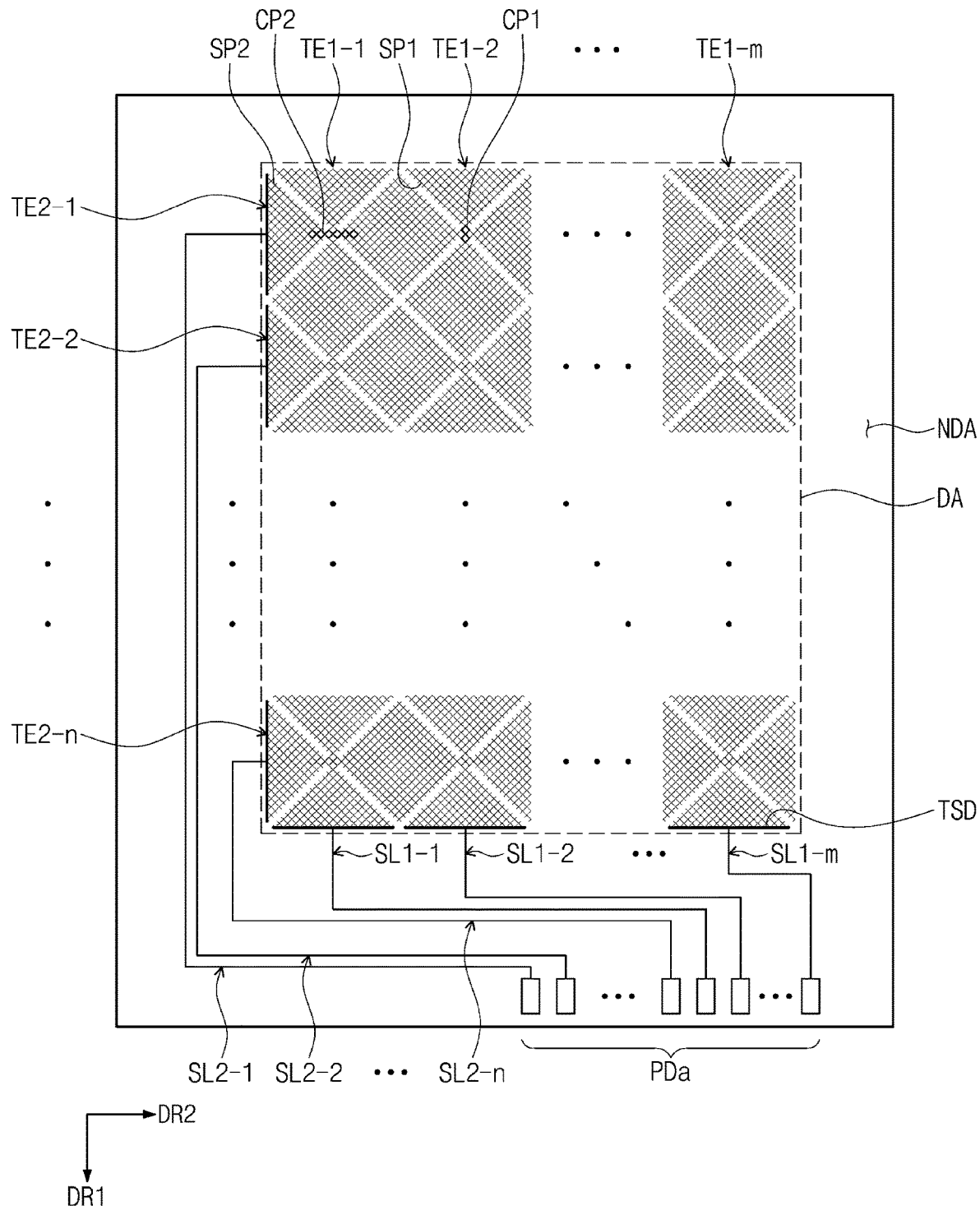
FIGS. 8B to 8E are partially top sectional views of the touch detection unit of FIG. 8A at various layers.

As shown in FIG. 8B, the touch detection unit TS may include a touch detection part TSP (see FIG. 5C), touch signal lines TSL (see FIG. 5C), and a pad part PDa.

The touch detection part TSP (see FIG. 5C) may include first touch electrodes TE1-1 to TE1-$m$ and second touch electrodes TE2-1 to TE2-$n$. The touch signal lines TSL (see FIG. 5C) may include first touch signal lines SL1-1 to SL1-$m$ connected to the first touch electrodes TE1-1 to TE1-$m$ and second touch signal lines SL2-1 to SL2-$n$ connected to the second touch electrodes TE2-1 to TE2-$n$.

The pad part PDa may be electrically connected to the first touch signal lines SL1-1 to SL1-$m$ and the second touch signal lines SL2-1 to SL2-$n$.

Connection electrodes TSD may be disposed between the first touch electrodes TE1-1 to TE1-$m$ and the first touch signal lines SL1-1 to SL1-$m$ and between the second touch electrodes TE2-1 to TE2-$n$ and the second touch signal lines SL2-1 to SL2-$n$. The connection electrodes TSD may be respectively connected to the ends of the first touch electrodes TE1-1 to TE1-$m$ and the second touch electrodes TE2-1 to TE2-$n$ in order to deliver signals. In various exemplary embodiments, the connection electrodes TSD may be omitted.

Each of the first touch electrodes TE1-1 to TE1-$m$ may have a mesh form where a plurality of touch opening parts are defined. Each of the first touch electrodes TE1-1 to TE1-$m$ includes a plurality of first touch sensor parts SP1 and a plurality of first connection parts CP1. The first touch sensor parts SP1 are arranged in the first direction DR1. Each of the first connection parts CP1 connects two adjacent first touch sensor parts SP1. Although not shown in the drawing, the first touch signal lines SL1-1 to SL1-$m$ may also have a mesh form.

The second touch electrodes TE2-1 to TE2-$n$ intersect the first touch electrodes TE1-1 to TE1-$m$ with an insulating gap therebetween. Each of the second touch electrodes TE2-1 to TE2-$n$ may have a mesh form where a plurality of touch opening parts are defined. Each of the second touch electrodes TE2-1 to TE2-$n$ includes a plurality of second touch sensor parts SP2 and a plurality of second connection parts CP2. The second touch sensor parts SP2 are arranged along the second direction DR2. Each of the second connection parts CP2 connects two adjacent second touch sensor parts SP2. The second touch signal lines SL2-1 to SL2-$n$ may also have a mesh form.

The first touch electrodes TE1-1 to TE1-$m$ are electrostatically bonded to the second touch electrodes TE2-1 to TE2-$n$. As touch detection signals are applied to the first touch electrodes TE1-1 to TE1-$m$, capacitors are formed between the first touch sensor parts SP1 and the second touch sensor parts SP2.

Parts of the plurality of first touch sensor parts SP1, the plurality of first connection parts CP1 and first touch signal lines SL1-1 to SL1-$m$, the plurality of second touch sensor parts SP2, the plurality of second connection parts CP2, and second touch signal lines SL2-1 to SL2-$n$ may be formed by patterning the first conductive layer TS-CL1 shown in FIG. 8A and the other parts may be formed by patterning the second conductive layer TS-CL2 shown in FIG. 8A.

In order to electrically connect conductive patterns disposed in one layer with conductive patterns disposed in another layer, a contact hole penetrating the first touch insulation layer TS-IL1 shown in FIG. 8A may be formed. Hereinafter, a touch detection unit TS according to an embodiment of the inventive concepts are described with reference to FIGS. 8C to 8E.

Figure 8C:
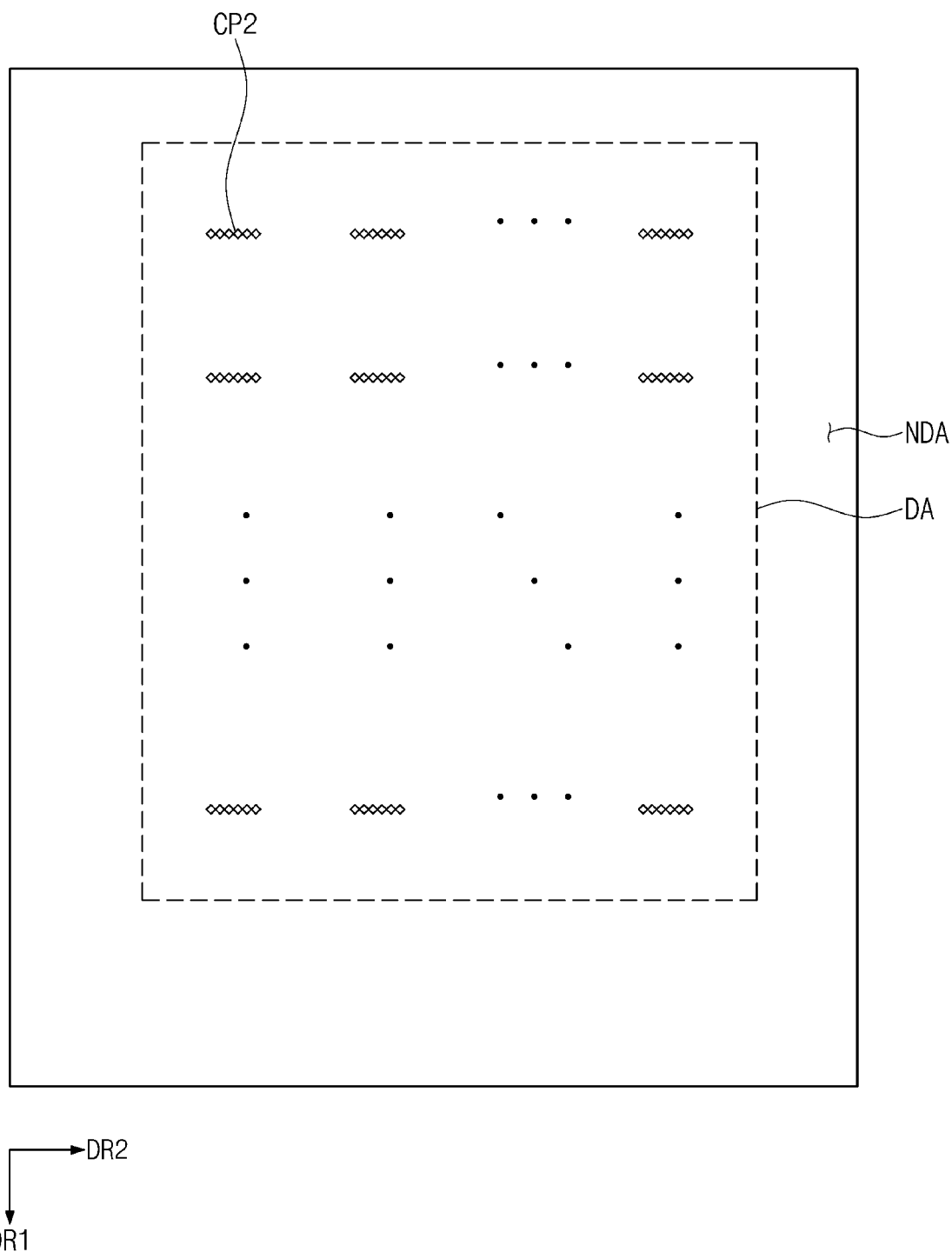

As shown in FIG. 8C, first conductive patterns are disposed on the thin film sealing layer TFE (see FIG. 8A). The first conductive patterns may include bridge patterns CP2. The bridge patterns CP2 are directly disposed on the thin film sealing layer TFE. The thin film sealing layer TFE covers the display area DA in the exemplary embodiment shown. The bridge patterns CP2 are another name for the second connection parts CP2 shown in FIG. 8B.

Figure 8D:
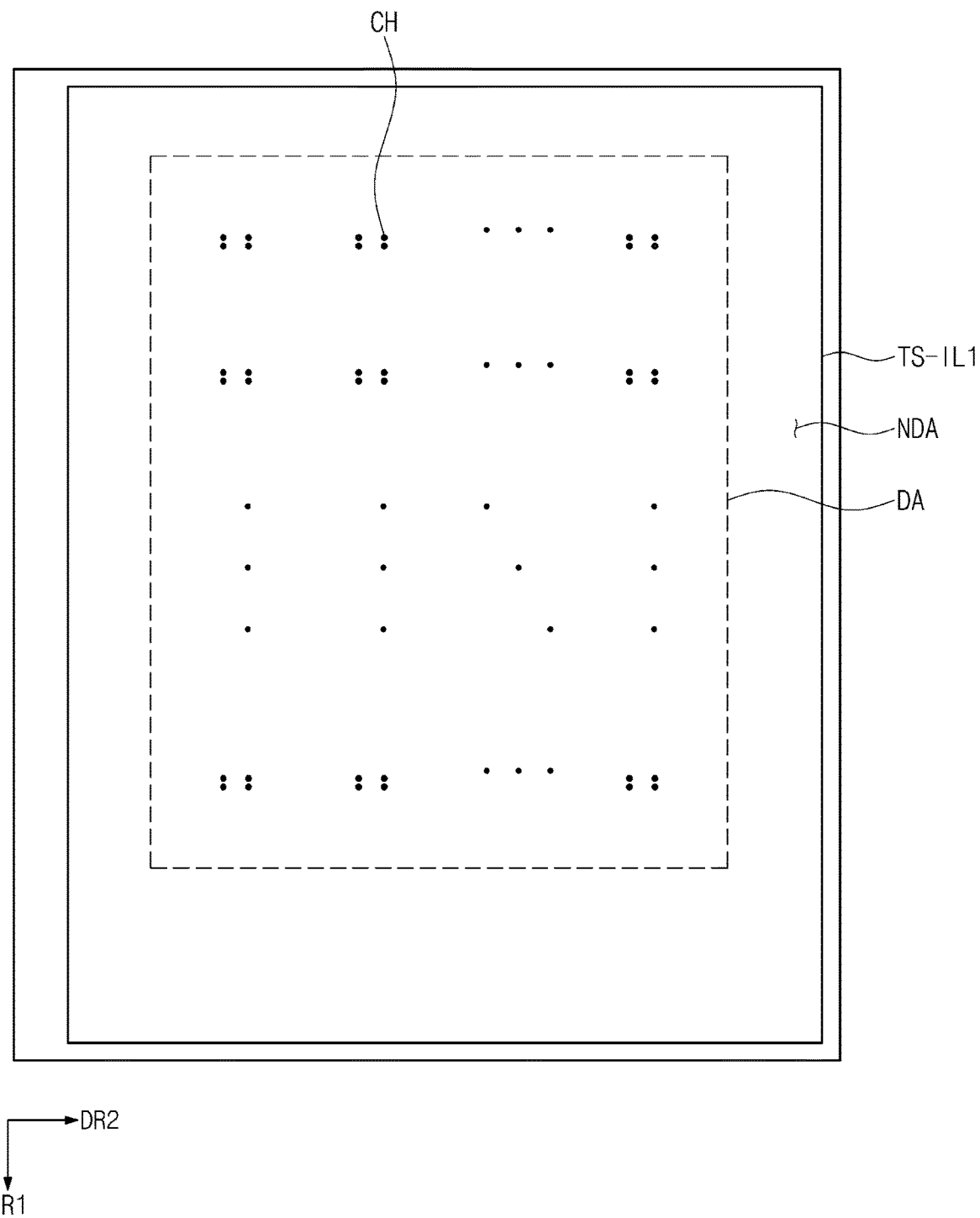

As shown in FIG. 8D, a first touch insulation layer TS-IL1 for covering the bridge patterns CP2 is disposed on the thin film sealing layer TFE. Contact holes CH for partially exposing the bridge patterns CP2 are defined in the first touch insulation layer TS-IL1. The contact holes CH may be formed through a photolitograph process.

Figure 8E:
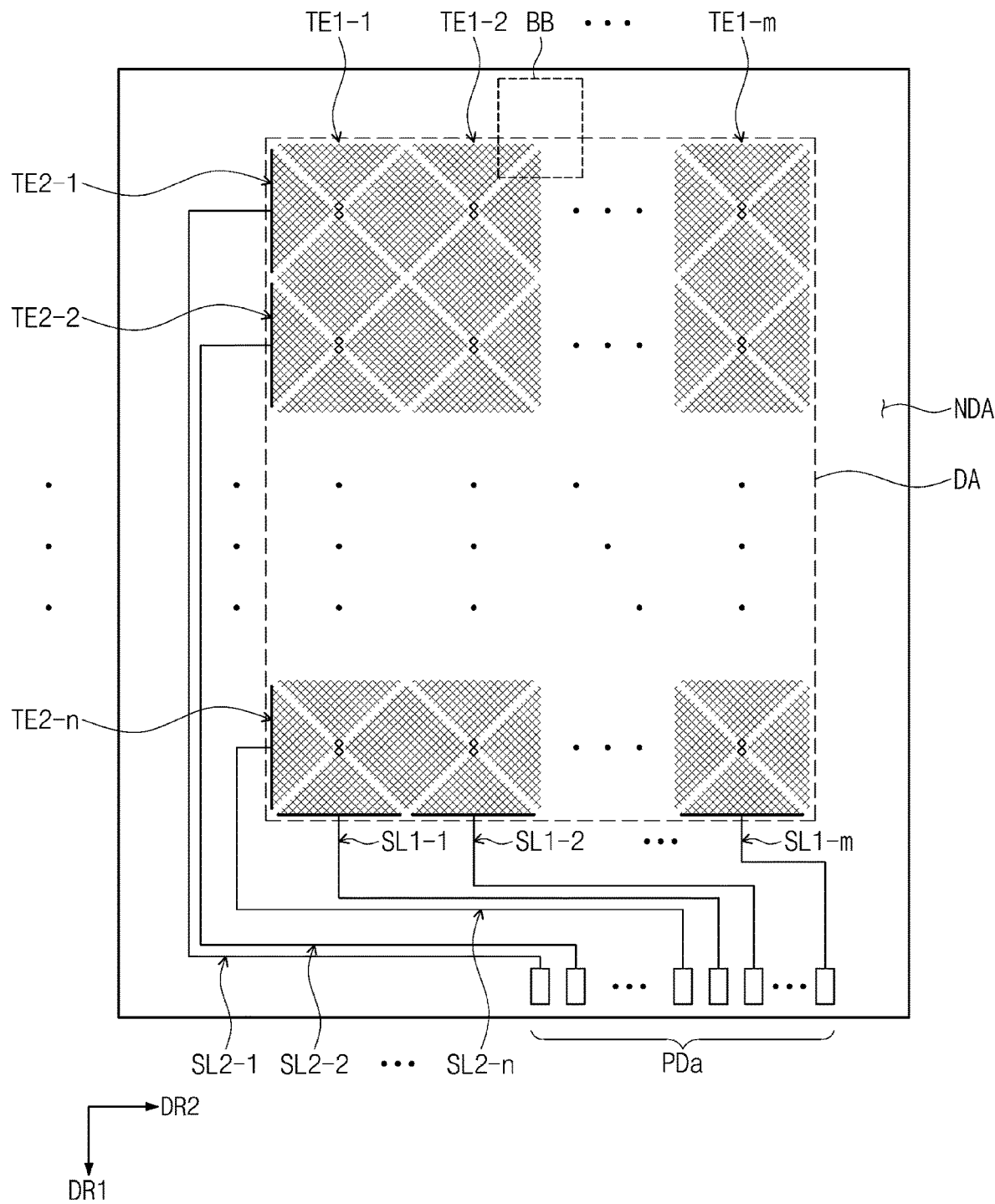

As shown in FIG. 8E, second conductive patterns are disposed on the first touch insulation layer TS-IL1. The second conductive patterns may include the plurality of first touch sensor parts SP1 (see FIG. 8B), plurality of first connection parts CP1, first touch signal lines SL1-1 to SL1-$m$, the plurality of second touch sensor parts SP2 (see FIG. 8B), and second touch signal lines SL2-1 to SL2-$n$. Although not shown in the drawing, a second touch insulation layer TS-IL2 for covering the second conductive patterns is disposed on the first touch insulation layer TS-IL1.

The first conductive patterns may include the second touch electrodes TE1-1 to TE1-$m$ and the first touch signal lines SL1-1 to SL1-$m$. The first conductive patterns may include the second touch electrodes TE2-1 to TE2-$n$ and the second touch signal lines SL2-1 to SL2-$n$. In various exemplary embodiments, the contact holes CH are not defined in the first touch insulation layer TS-IL1.

The first conductive patterns and the second conductive patterns may be interchanged. That is, the second conductive patterns may include the bridge patterns CP2.

Figure 8F:
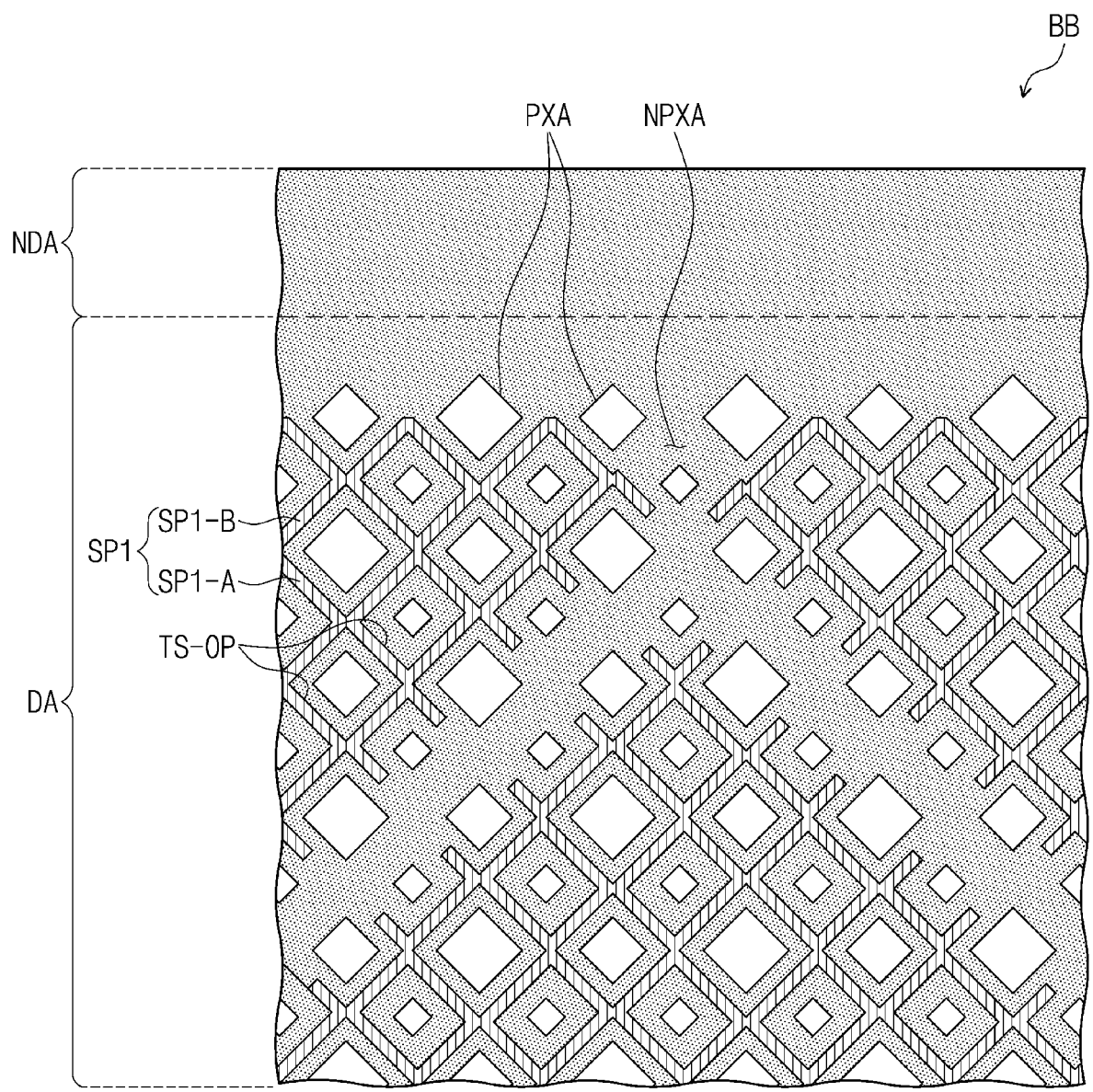
FIG. 8F is an enlarged view of area BB of FIG. 8E.

As shown in FIG. 8F, a first touch sensor part SP1 overlaps a non-light emitting area NPXA. The first touch sensor part SP1 includes a plurality of first extension parts SP1-A extending in a fifth direction DR5 intersecting the first direction DR1 and the second direction DR2 and a plurality of second extension parts SP1-B extending in a sixth direction DR6 intersecting the fifth direction DR5. The plurality of first extension parts SP1-A and the plurality of second extension parts SP1-B may be defined by mesh lines. A line width of the mesh lines may be several micrometers.

The plurality of first extension parts SP1-A and the plurality of second extension parts SP1-B are connected to each other to form a plurality of touch opening parts TS-OP. That is, the first touch sensor part SP1 has a mesh form including the plurality of touch opening parts TS-OP. Although it is shown that the touch opening parts TS-OP correspond to the light emitting areas PXA in a one-to-one relationship, other embodiments have other ratios of correspondence there between. Thus, in various exemplary embodiments, one touch opening part TS-OP may correspond to two or more light emitting areas PXA.

The sizes of the light emitting areas PXA may also vary. For example, the sizes of light emitting areas PXA for providing blue light and light emitting areas PXA for providing red light among the light emitting areas PXA may vary. Accordingly, the sizes of the touch opening parts TS-OP may also vary. Although it is shown in FIG. 8F that the sizes of the light emitting areas PXA vary, the inventive concepts are not limited thereto. The sizes of the light emitting areas PXA may be identical to each other and the sizes of the touch opening parts TS-OP may be also identical to each other.

Figure 9A:
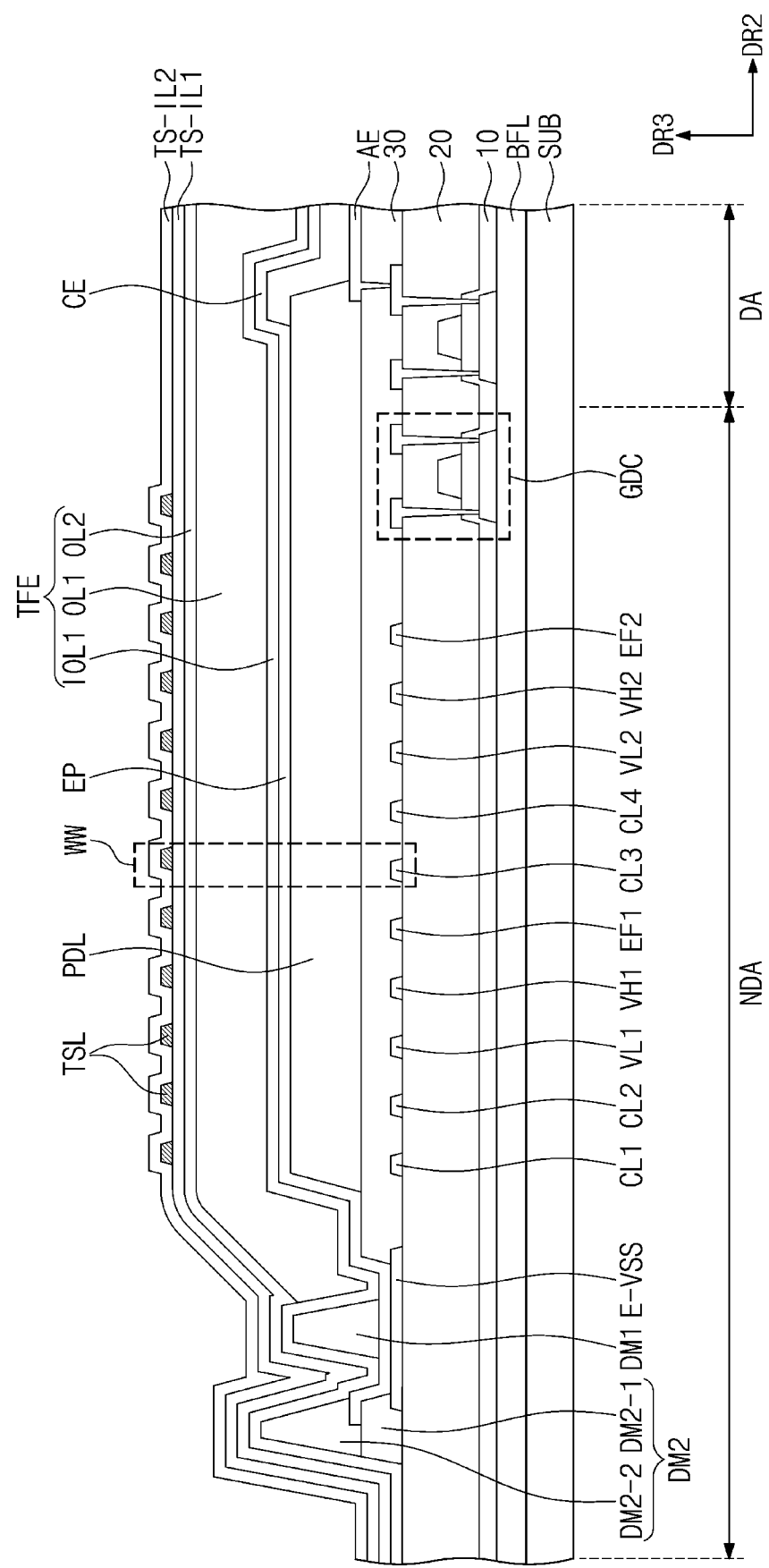
FIG. 9A is an enlarged, fragmented sectional view of an embodiment of area AA of FIG. 5C.
Figure 9B:
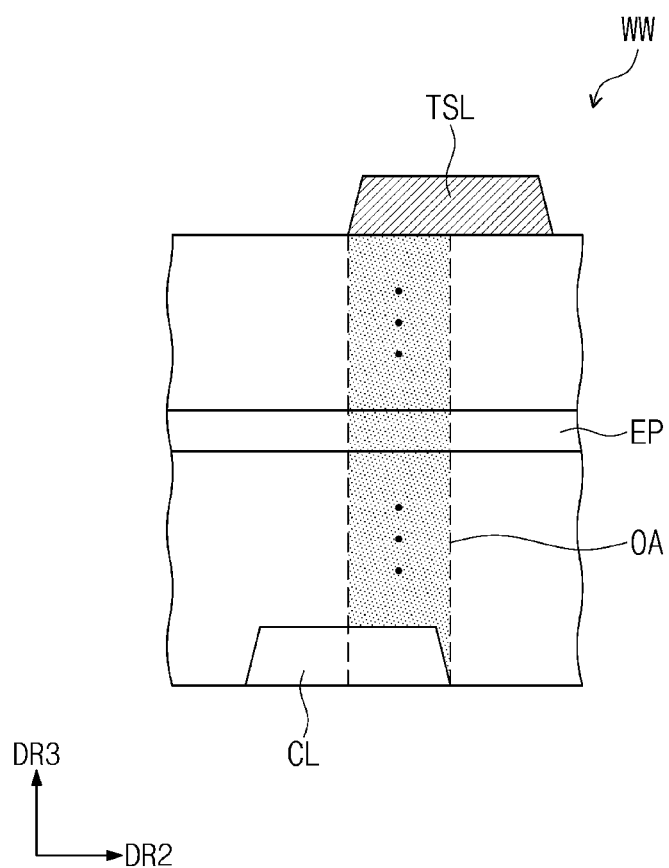
FIG. 9B is an enlarged, fragmented sectional view of area WW of FIG. 9A.

Referring to FIGS. 9A and 9B, touch signal lines TSL are shown. The touch signal lines TSL may be, for example, the second touch signal lines SL2-1 to SL2-$n$ shown in FIG. 8B.

A conductive portion EP may be disposed between the touch signal lines TSL and the plurality of clock signal lines CL1, CL2, CL3, and CL4 (hereinafter referred to collectively as CL). The conductive portion EP may be formed as layer and may be disposed on the same layer as the second electrode CE. For example, the conductive portion EP and the second electrode CE may both be disposed on the pixel definition layer PDL. The meaning of "disposed on the same layer" (for example, the pixel definition layer PDL) does not necessarily mean disposed only a flat surface at the same level or height. For example, where a given layer has different levels or heights such that the layer appears in the cross-sectional Figure(s) at different heights in third direction DR3, other elements that are both disposed "on" that layer may or may not be disposed at different levels or heights in the third direction DR3. "Disposed on" refers to relationships in which the layers touch each other and those in which they are separated by intervening elements or layers.

The second electrode CE may extend toward the conductive portion EP and the second electrode CE and the conductive portion EP may be connected to each other. That is, the second electrode CE and the conductive portion EP may be formed through the same process.

The conductive portion EP may be electrically connected to the power supply line E-VSS. The conductive portion EP may receive the second voltage ELVSS (see FIG. 6A) from the power supply line E-VSS.

The conductive portion EP may extend over and cover all or part of an overlapping area OA where the touch signal lines TSL and the clock signal lines CL overlap in a vertical direction as indicated by the overlapping area OA in FIG. 9B. For example, the conductive portion EP may completely cover (traverse) the overlapping area OA such that the conductive portion EP is between the clock signal line CL and the touch signal line TSL at all portions thereof that overlap in the vertical direction, as shown in FIG. 9B. This vertical direction may also be referred to as the overlapping direction (indicated in FIG. 9A and FIG. 9B by the third direction DR3). The conductive portion EP may conduct electrical signals laterally away from in the touch signal lines TSL, thereby reducing or preventing noise caused by a clock signal applied to the clock signal lines CL from reaching the touch signal lines TSL. Accordingly, the conductive portion EP may, in turn, reduce or prevent a change in the touch sensitivity that otherwise would be caused by noise from the clock signal lines CL.

A first dam part DM1 and a second dam part DM2 may be disposed in the non-display area NDA. The first dam part DM1 and the second dam part DM2 may be disposed surrounding the display area DA so that, when an organic monomer is printed to form the organic thin film OL1 of the thin film sealing layer TFE, the first dam part DM1 and the second dam part DM2 may prevent the organic monomer from overflowing beyond the non-display area NDA surrounding the display area DA where the first dam part DM1 and the second dam part DM2 are disposed.

The first dam part DM1 may be disposed on the power supply line E-VSS. The first dam part DM1 may be formed of a single layer and may be formed at the same time as the pixel definition layer PDL.

The second dam part DM2 may be disposed outside the first dam part DM1. Thus, a distance between the second dam part DM2 and the display area DA may be greater than a distance between the first dam part DM1 and the display area DA.

The second dam part DM2 may cover a portion of the power supply line E-VSS. The second dam part DM2 may be formed of a plurality of layers and include a first dam layer DM2-1 and a second dam layer DM2-2. The first dam layer DM2-1 may be formed at the same time as the third insulation layer 30; and, the second dam layer DM2-2 may be formed at the same time as the pixel definition layer PDL.

Although FIG. 9A shows that the pixel definition layer PDL extends to overlap all of the clock signal lines CL in the third direction DR3, in other embodiments the pixel definition layer PDL does not overlap all of the clock signal lines CL or does not overlap them completely. Thus, in various exemplary embodiments, the pixel definition layer PDL may extend only to an area overlapping the gate driving circuit GDC, and/or may extend to an area overlapping only some of the clock signal lines CL. For example, the pixel definition layer PDL might extend only to an area overlapping a third clock signal line CL3, a fourth clock signal line CL4, a third voltage line VL2, a fourth voltage line VH2, and a second start signal line EF2.

Figure 9C:
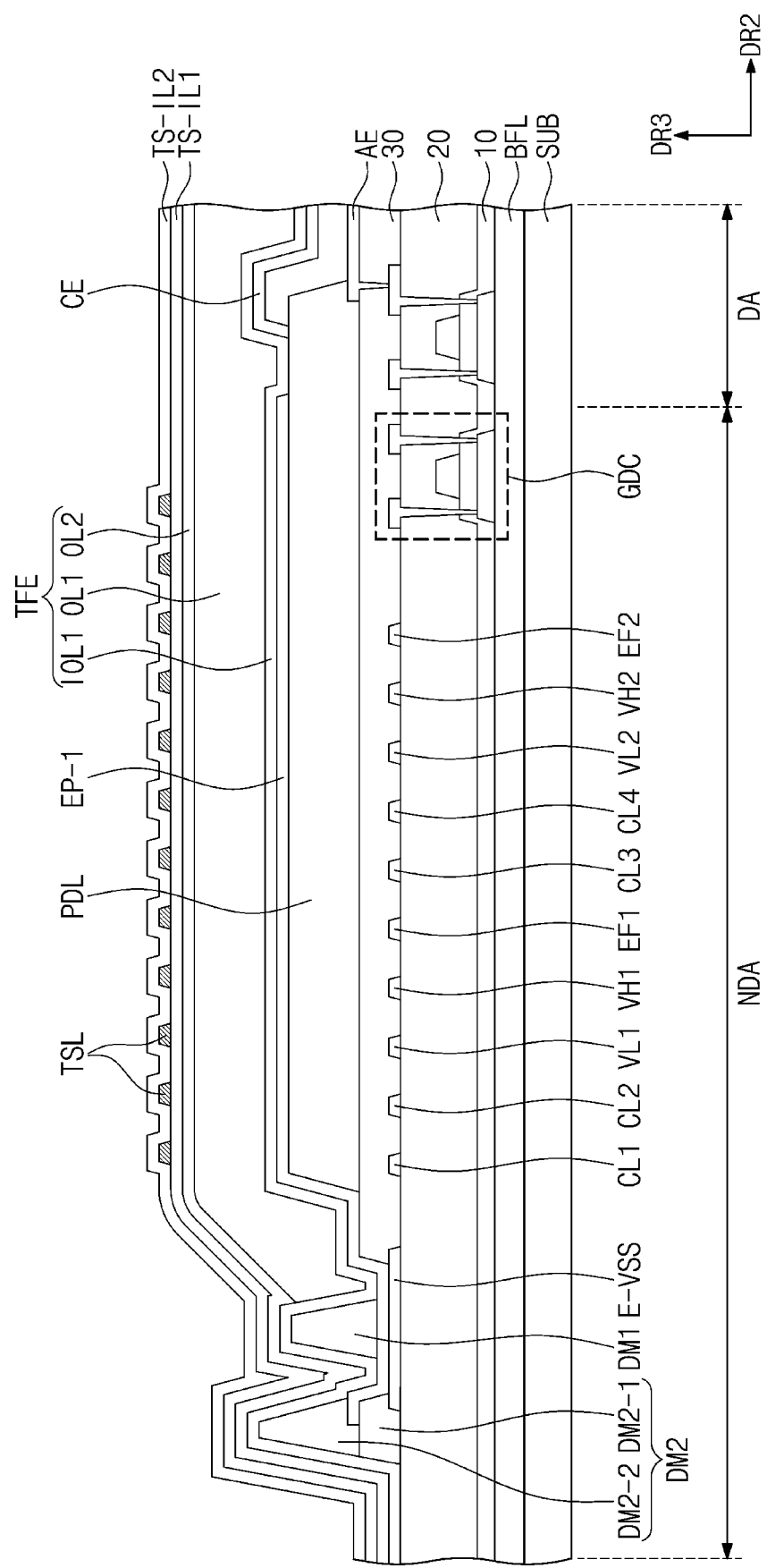
FIG. 9C is similar to FIG. 9A with the dotted outline of area WW removed.

Referring to FIG. 9C, a conductive portion EP-1 may be disposed between the touch signal lines TSL and the plurality of clock signal lines CL (see FIG. 9B). The conductive portion EP-1 may be disposed on the same layer as the second electrode CE. For example, the conductive portion EP-1 and the second electrode CE may both be disposed on the pixel definition layer PDL.

The conductive portion EP-1 may be spaced from the second electrode CE. That is, the conductive portion EP-1 and the second electrode CE might not be connected to each other physically. The conductive portion EP-1 may be electrically connected to the power supply line E-VSS. The conductive portion EP-1 may receive the second voltage ELVSS (see FIG. 6A) from the power supply line E-VSS. In other embodiments, constant voltage may be applied to the conductive portion EP-1. For example, the first voltage ELVDD (see FIG. 6A) may be applied to the conductive portion EP-1, or ground voltage may be applied to the conductive portion EP-1, or another constant voltage other than the voltages listed above may be applied to the conductive portion EP-1.

The second electrode CE may be electrically connected to the power supply line E-VSS through a pattern (not shown). Accordingly, the second electrode CE may receive the second voltage ELVSS (see FIG. 6A) from the power supply line E-VSS.

The conductive portion EP-1 may reduce or prevent the touch sensitivity of a touch detection unit from being changed due to noise created by a signal applied to the clock signal lines CL.

Figure 9D:
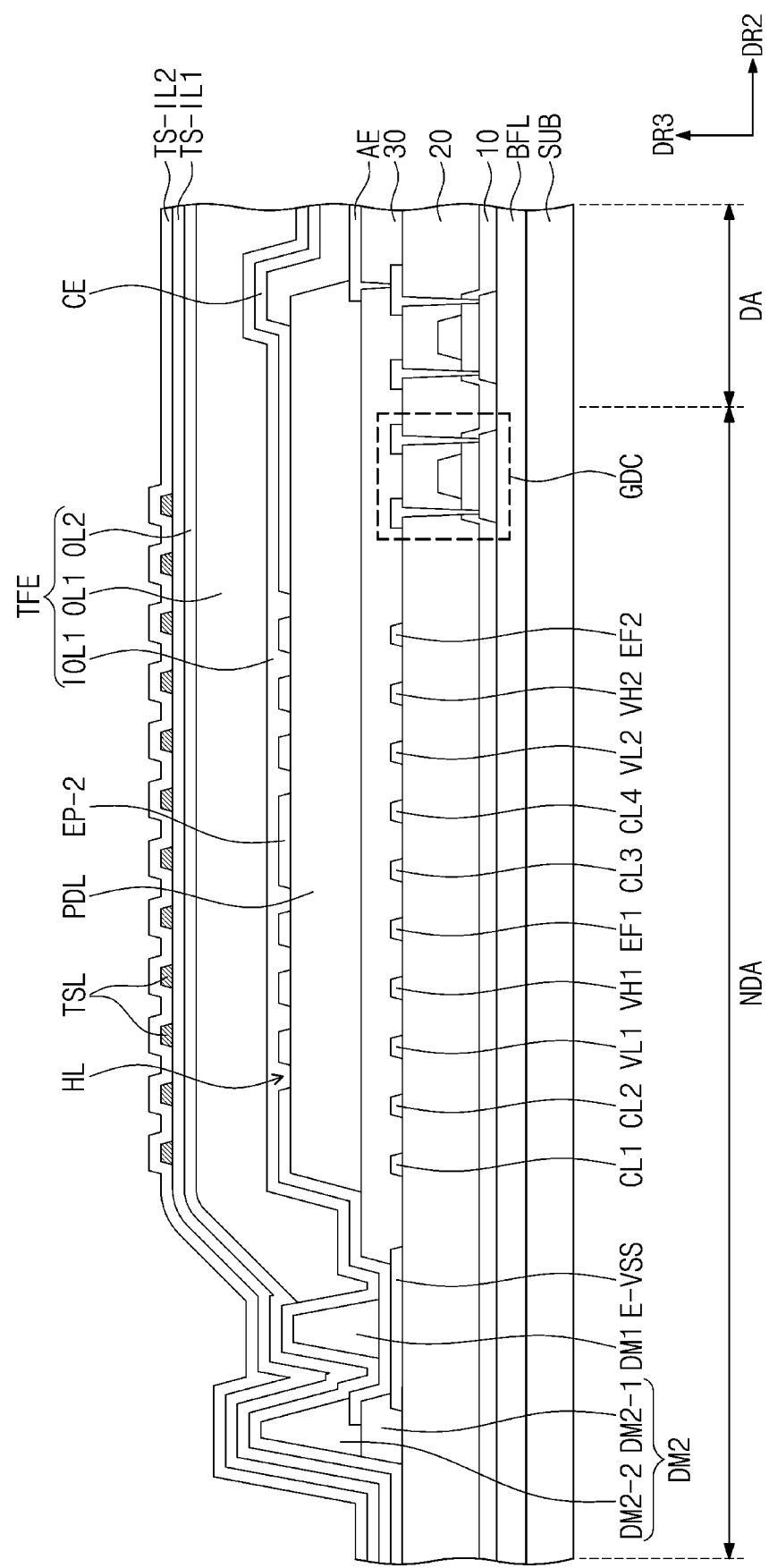
FIG. 9D is an enlarged, fragmented sectional view of another embodiment of area AA of FIG. 5C.

Referring to FIG. 9D, a conductive portion EP-2 may be disposed between the touch signal lines TSL and the plurality of clock signal lines CL (see FIG. 9B). The conductive portion EP-2 may be disposed on the same layer as the second electrode CE.

A plurality of through holes HL may be defined in the conductive portion EP-2. The plurality of through holes HL may serve to discharge gases occurring from layers including an organic layer. The plurality of through holes HL might not overlap the overlapping area OA (see FIG. 9B) where the touch signal lines TSL and the clock signal lines CL overlap. In FIG. 9D the through holes HL are not defined in an area overlapping the clock signal lines CL (see FIG. 9B) in the third direction DR3. According to another embodiment of the inventive concept, the through holes HL may not be defined in an area overlapping the touch signal lines TSL in the third direction DR3.

Because the through holes HL are not defined in the overlapping area OA (see FIG. 9B), even if the through holes HL are provided to the conductive portion EP-2, the phenomenon where a touch sensitivity of a touch detection unit is changed in response to noise created by a signal applied to the clock signal lines CL may nevertheless be prevented despite the presence of the through holes in other locations.

Figure 10A:
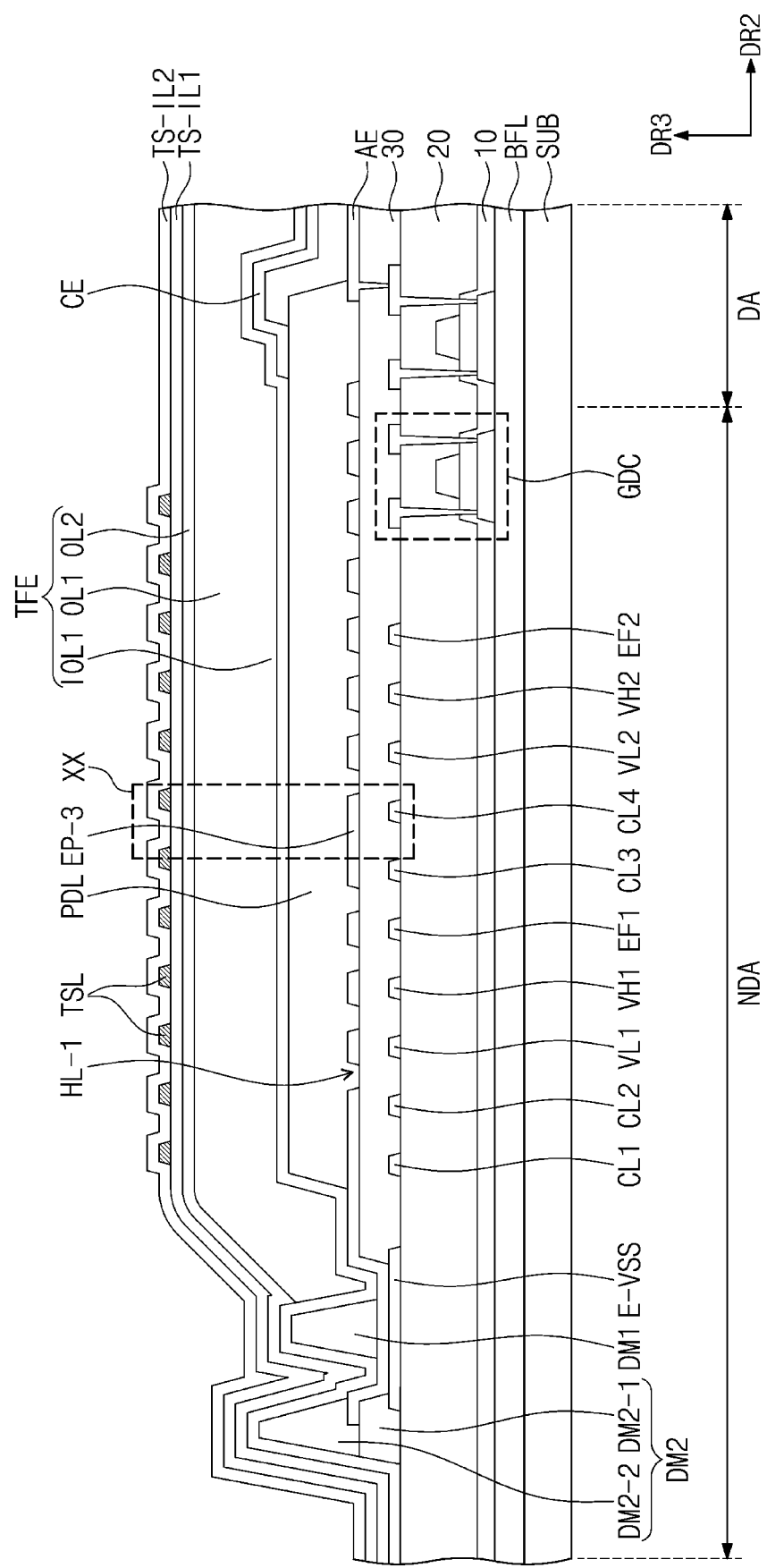
FIG. 10A is an enlarged, fragmented sectional view of another embodiment of area AA of FIG. 5C.
Figure 10B:
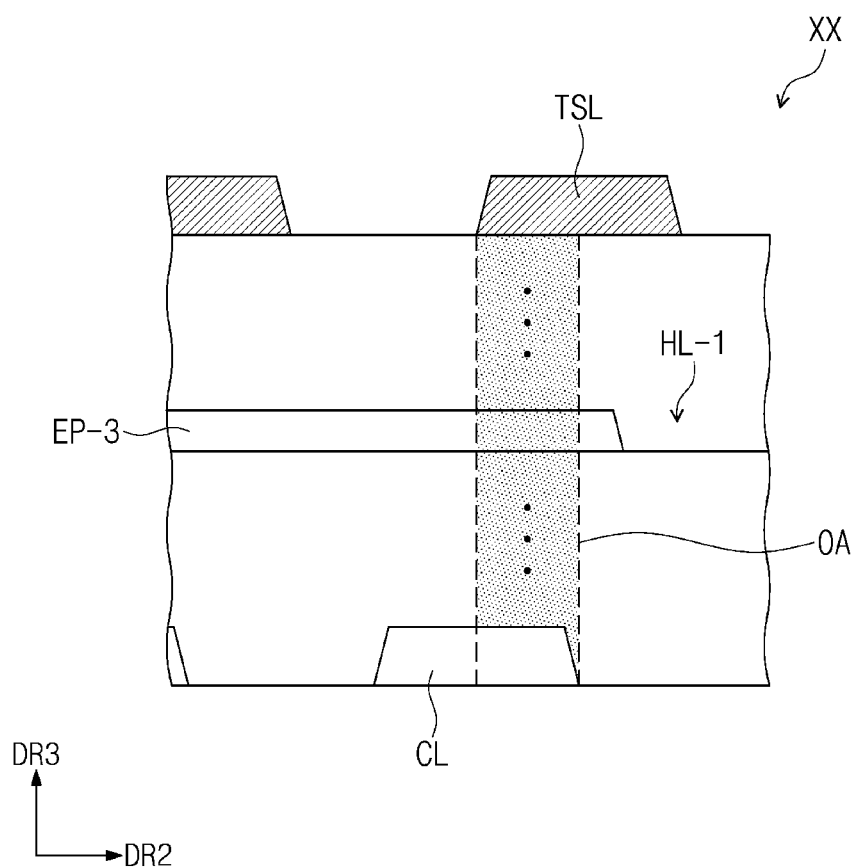
FIG. 10B is an enlarged, fragmented sectional view of area XX of FIG. 10A.

Referring to FIGS. 10A and 10B, a conductive portion EP-3 may be disposed between the touch signal lines TSL and the plurality of clock signal lines CL. The conductive portion EP-3 may be disposed on the same layer as the first electrode AE. For example, the conductive portion EP-3 and the first electrode AE may both be disposed on the third insulation layer 30. The first electrode AE and the conductive portion EP-3 may be formed through the same process.

The conductive portion EP-3 may be electrically connected to the power supply line E-VSS. The conductive portion EP-3 may receive the second voltage ELVSS (see FIG. 6A) from the power supply line E-VSS. Alternatively, a constant voltage may be applied to the conductive portion EP-3. For example, the first voltage ELVDD (see FIG. 6A) may be applied to the conductive portion EP-3, or ground voltage may be applied to the conductive portion EP-3, or another constant voltage other than the voltages listed above may be applied to the conductive portion EP-3.

A plurality of through holes HL-1 may be defined in the conductive portion EP-3. The through holes HL-1 may serve to discharge gases occurring from layers including an organic layer. The through holes HL-1 might not overlap an overlapping area OA where the touch signal lines TSL and the clock signal lines CL overlap in the third direction DR3. In more detail, referring to FIG. 10A, the through holes HL-1 might not be defined in an area overlapping the clock signal lines CL in the third direction. Accordingly, the conductive portion EP-3 may completely cover the overlapping area OA where the touch signal lines TSL and the clock signal lines CL overlap in the third direction DR3. The conductive portion EP-3 may prevent noise generated on the touch signal lines TSL by a signal applied to the clock signal lines CL. That is, a change of a touch sensitivity may be reduced or even eliminated by the presence of the conductive portion EP-3 and a touch detection unit having a uniform touch sensitivity may thereby be provided.

Figure 10C:
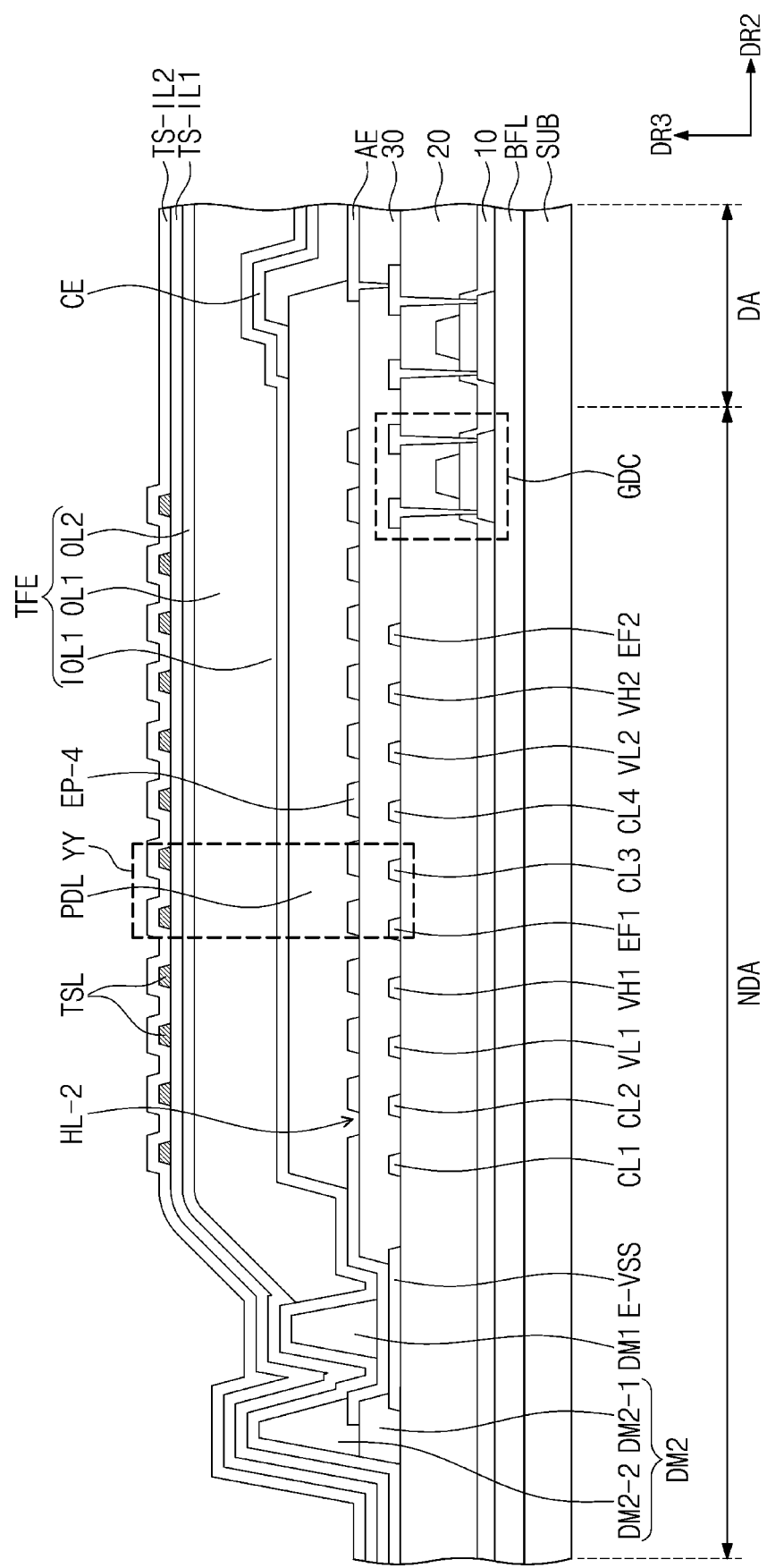
FIG. 10C is an enlarged, fragmented sectional view of another embodiment of area AA of FIG. 5C.
Figure 10D:
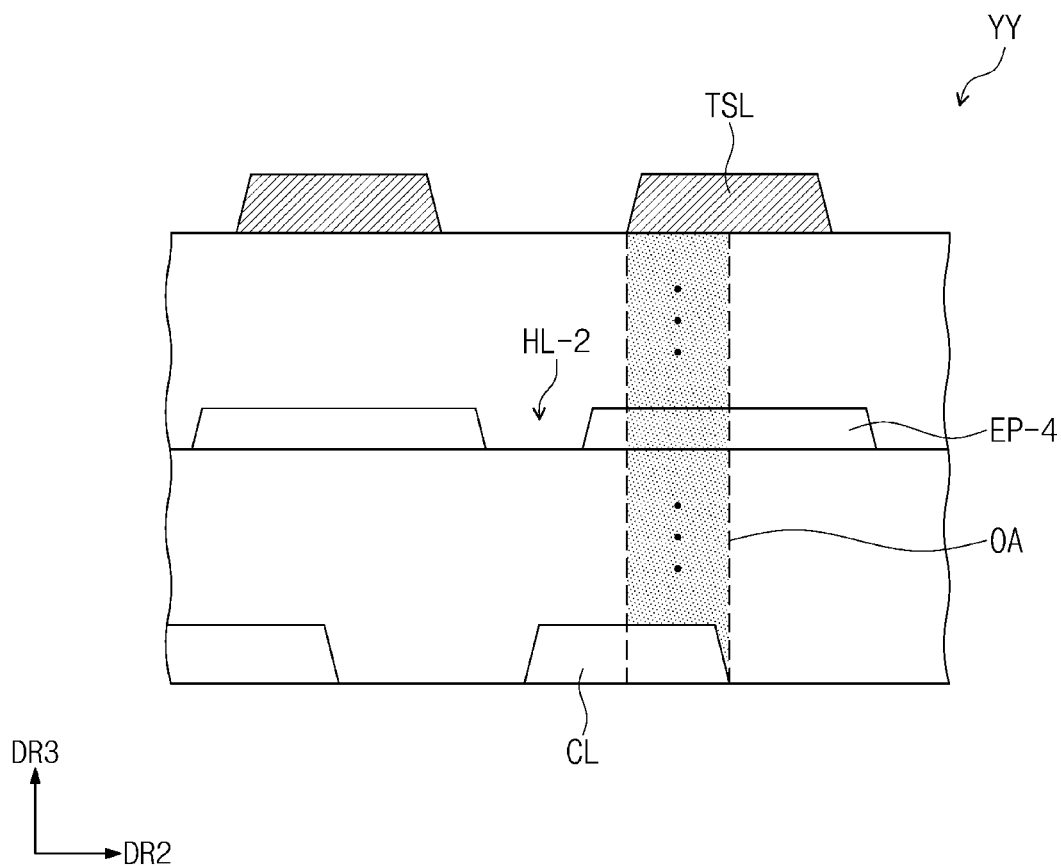
FIG. 10D is an enlarged, fragmented sectional view of area YY of FIG. 10C.

Referring now to FIGS. 10C and 10D, a conductive portion EP-4 may be disposed between the touch signal lines TSL and the plurality of clock signal lines CL. A plurality of through holes HL-2 may be defined in the conductive portion EP-4.

The through holes HL-2 might not overlap an overlapping area OA where the touch signal lines TSL and the clock signal lines CL overlap in the third direction DR3. In more detail, referring to FIG. 10C, the through holes HL-2 might not be defined in an area overlapping the touch signal lines TSL in the third direction DR3.

A conductive portion EP-4 below the touch signal lines TSL may block a signal applied to the clock signal lines CL from interfering with signals passing through the touch signal lines TSL. That is, since the through holes HL-2 are not defined in an area overlapping the touch signal lines TSL, noise due to the influence of a signal of each of the clock signal lines CL might not be generated in the touch signal lines TSL.

Figure 11A:
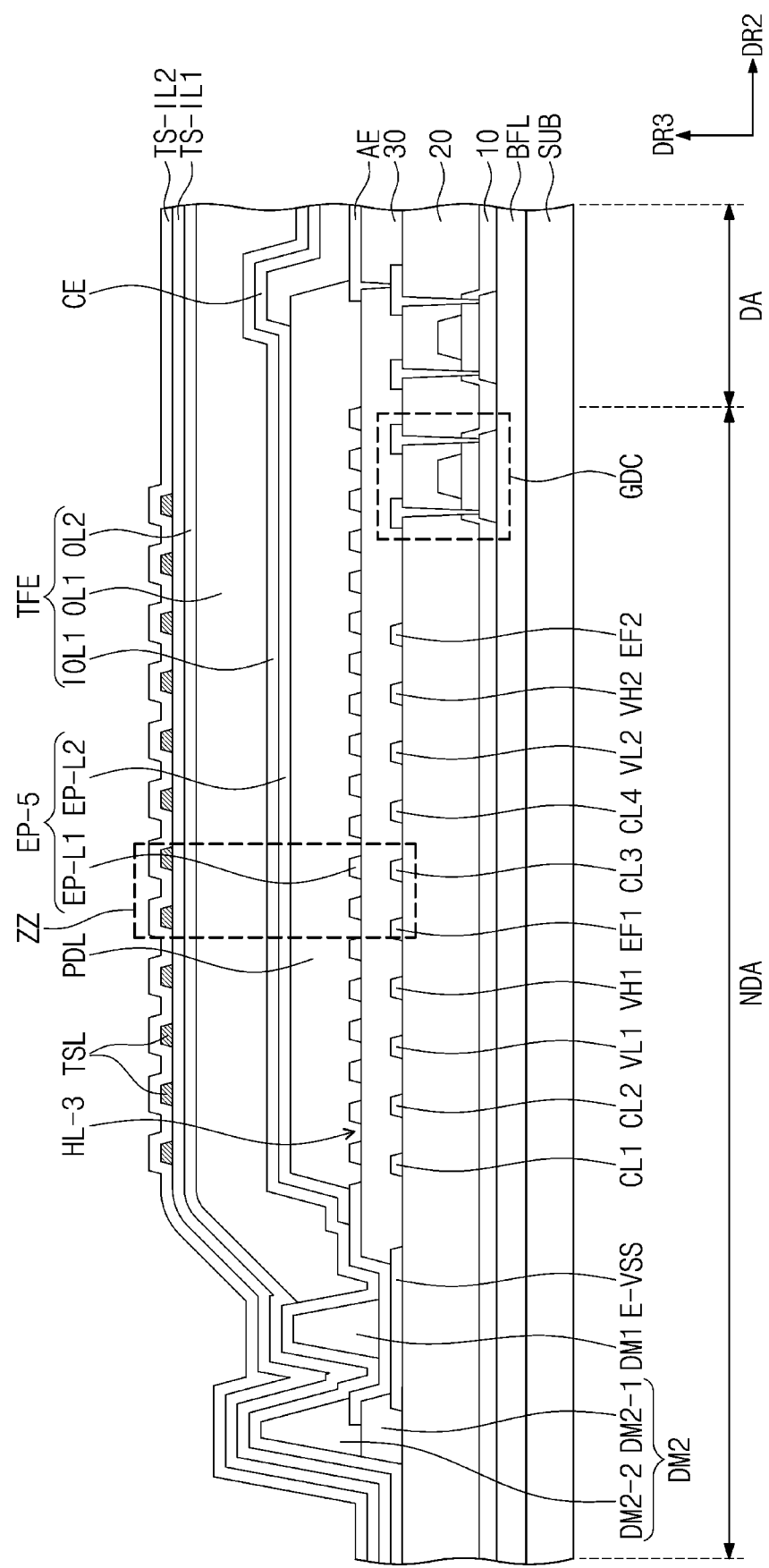
FIG. 11A is an enlarged, fragmented sectional view of another embodiment of area AA of FIG. 5C.
Figure 11B:
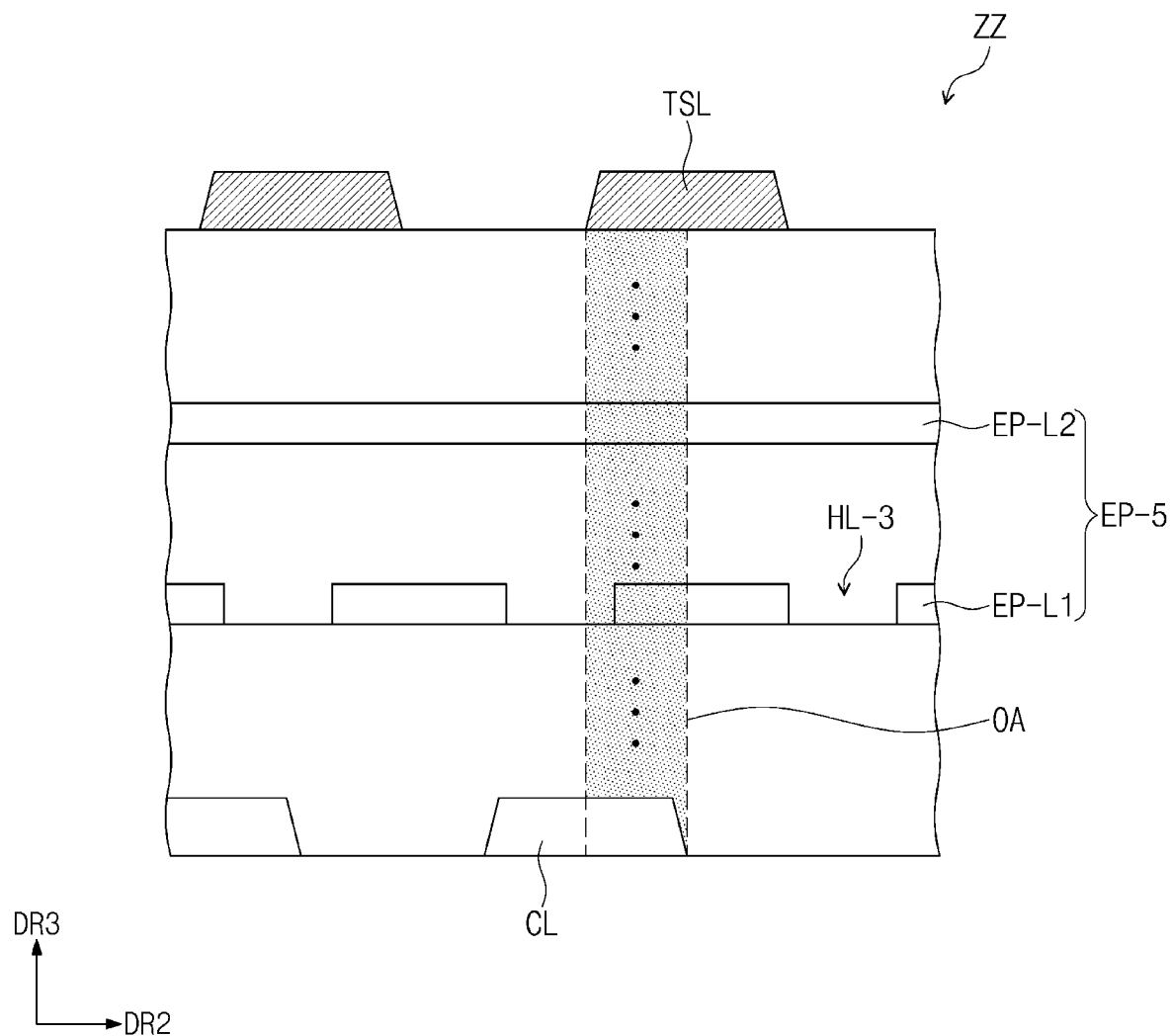
FIG. 11B is an enlarged, fragmented sectional view of area ZZ of FIG. 11A.

Referring to FIGS. 11A and 11B, a conductive portion EP-5 may be disposed between the touch signal lines TSL and the plurality of clock signal lines CL. The conductive portion EP-5 may include a first conductive layer EP-L1 and a second conductive layer EP-L2. The first conductive layer EP-L1 may be disposed on the same layer as the first electrode AE and the second conductive layer EP-L2 may be disposed on the same layer as the second electrode CE. For example, the first conductive layer EP-L1 and the first electrode AE may be disposed on the third insulation layer 30, and the second conductive layer EP-L2 and the second electrode CE may be disposed on the pixel definition layer PDL. The first conductive layer EP-L1 and the first electrode AE may be formed through the same process, and the second conductive layer EP-L2 and the second electrode CE may be formed through the same process.

Each of the first conductive layer EP-L1 and the second conductive layer EP-L2 may be electrically connected to the power supply line E-VSS. Each of the first conductive layer EP-L1 and the second conductive layer EP-L2 may receive the second voltage ELVSS (see FIG. 6A) from the power supply line E-VSS. Alternatively, a constant voltage may be applied to the second conductive layer EP-L2. For example, the first voltage ELVDD (see FIG. 6A) may be applied to the second conductive layer EP-L2, or ground voltage may be applied to the conductive layer EP-L2, or another constant voltage other than the voltages listed above may be applied to the conductive layer EP-L2.

A plurality of first through holes HL-3 may be defined in a first conductive layer EP-L1. The plurality of first through holes HL-3 may serve to discharge gases occurring from layers including an organic layer. Although it is shown in FIG. 11A that the plurality of first through holes HL-3 are spaced at a predetermined interval from each other, in other embodiments, the spacing there between is not constant.

The second conductive layer EP-L2 may cover all the plurality of first through holes HL-3 such that they overlap in the third direction DR3. According to this embodiment, a double shield may be provided between the touch signal lines TSL and the plurality of clock signal lines CL by the first conductive layer EP-L1 and the second conductive layer EP-L2. Additionally, an area not shielded by the plurality of first through holes HL-3 in the third direction DR3 may be shielded because the second conductive layer EP-L2 covers the plurality of first through holes HL-3 in the third direction DR3. Accordingly, even if high and low levels of voltages are applied to the plurality of clock signal lines CL alternatively, a signal applied to the plurality of clock signal lines CL is blocked by the first conductive layer EP-L1 and the second conductive layer EP-L2, so that noise might not be generated therefrom on the touch signal lines TSL.

Figure 11C:
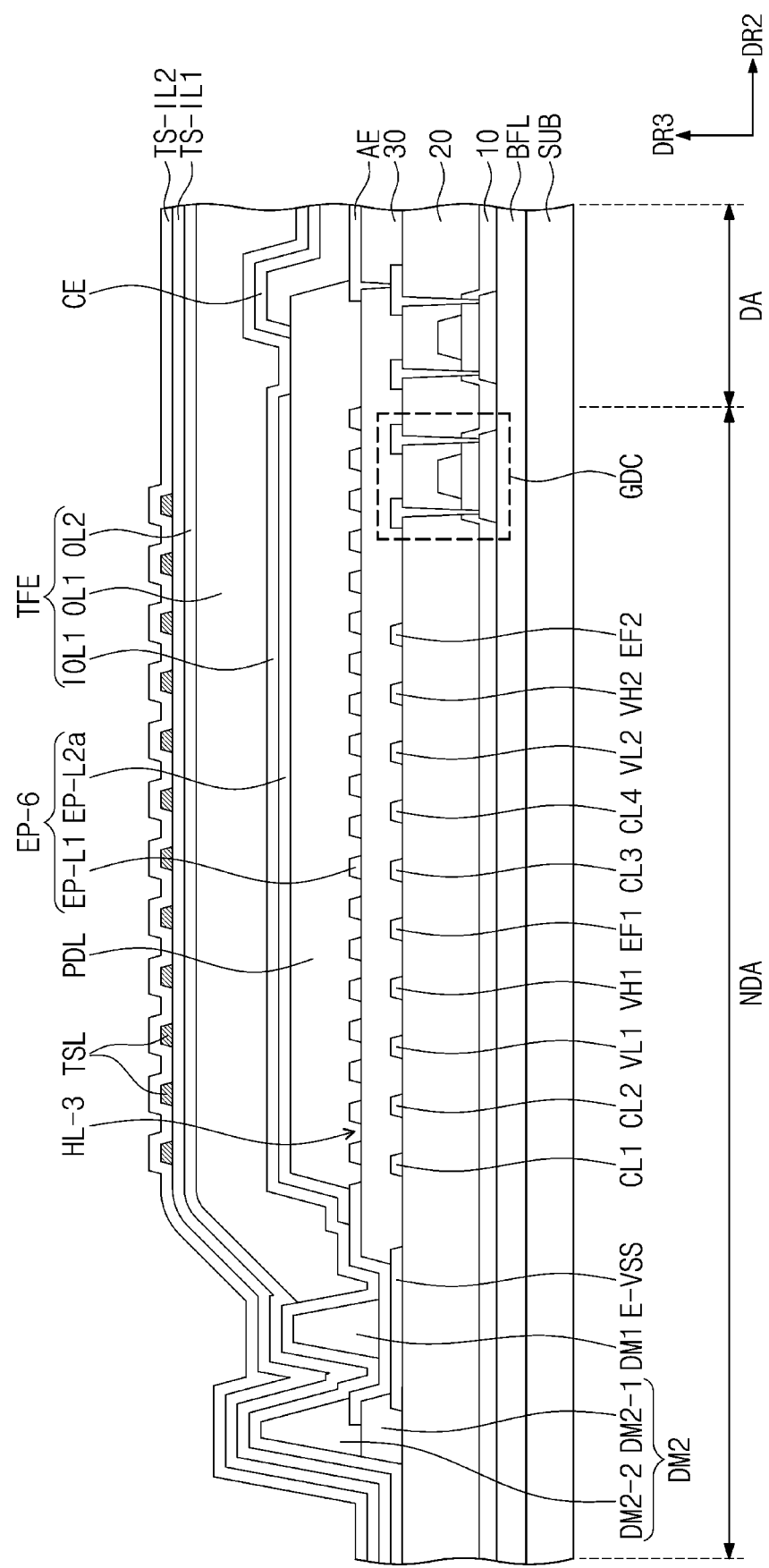
FIG. 11C is an enlarged, fragmented sectional view of another embodiment of area AA of FIG. 5C.

Referring now to FIG. 11C, a conductive portion EP-6 may be disposed between the touch signal lines TSL and the plurality of clock signal lines CL. The conductive portion EP-6 may include a first conductive layer EP-L1 and a second conductive layer EP-L2a. When compared to the conductive portion EP-5 described above with reference to FIG. 11A, the conductive portion EP-6 of FIG. 11C may have a different form in the second conductive layer EP-L2a.

Referring to FIG. 11A, the second electrode CE may extend toward the second conductive layer EP-L2, and the second electrode CE and the second conductive layer EP-L2 may be connected to each other physically. However, referring to FIG. 11C, the second conductive layer EP-L2a may be spaced apart from the second electrode CE. That is, as in FIG. 11C, the second conductive portion EP-L2a and the second electrode CE might not be connected to each other physically.

Figure 12A:
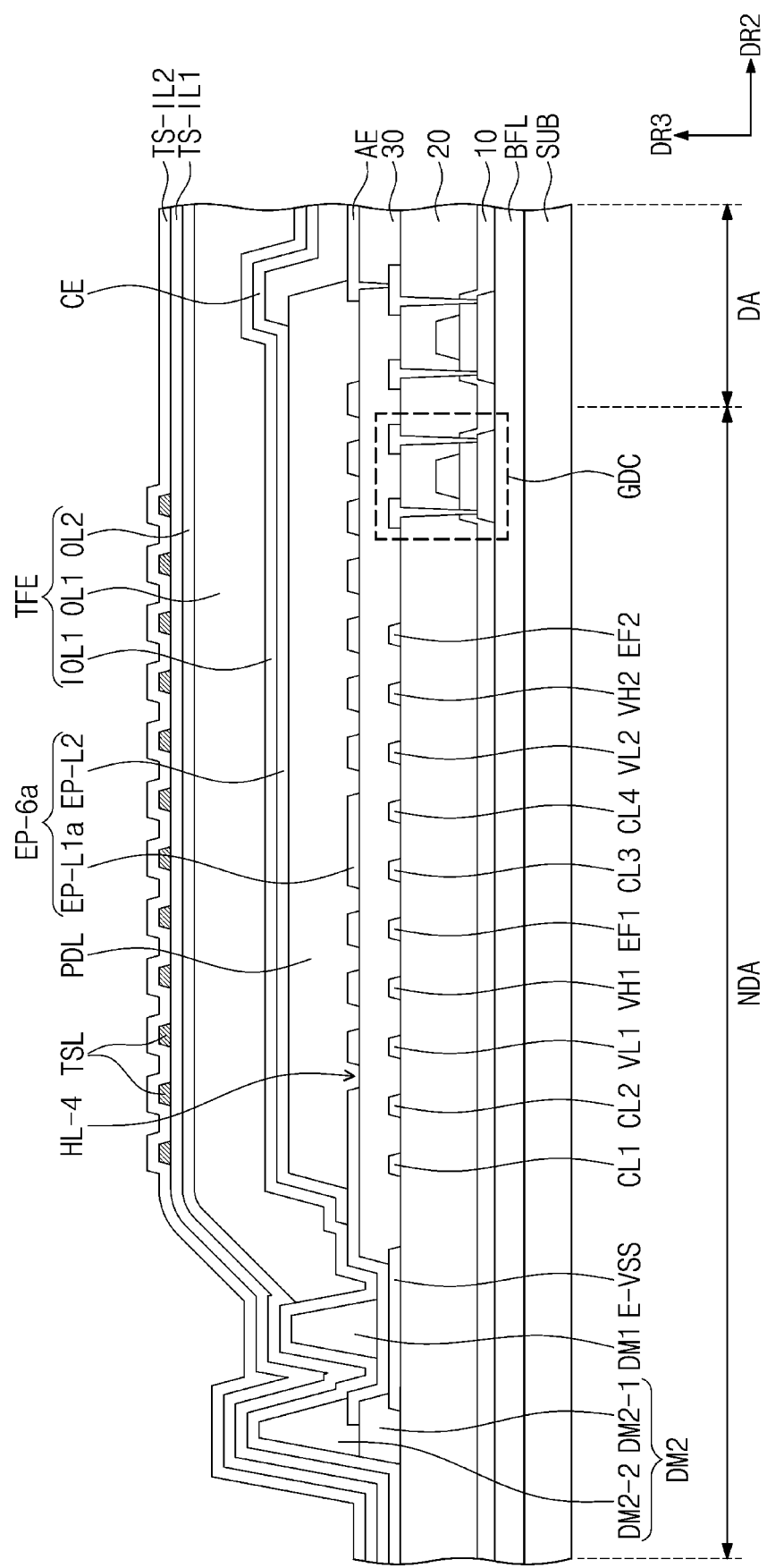
FIG. 12A is an enlarged, fragmented sectional view of another embodiment of area AA of FIG. 5C.

Referring now to FIG. 12A, a conductive portion EP-6a may be disposed between the touch signal lines TSL and the plurality of clock signal lines CL. The conductive portion EP-6a may include a first conductive layer EP-L1a and a second conductive layer EP-L2. The first conductive layer EP-L1a may be disposed on the same layer as the first electrode AE and the second conductive layer EP-L2 may be disposed on the same layer as the second electrode CE. For example, the first conductive layer EP-L1a and the first electrode AE may be disposed on the third insulation layer 30, and the second conductive layer EP-L2 and the second electrode CE may be disposed on the pixel definition layer PDL. The first conductive layer EP-L1a and the first electrode AE may be formed through the same process, and the second conductive layer EP-L2 and the second electrode CE may be formed through the same process.

A plurality of first through holes HL-4 may be defined in the first conductive layer EP-L1a. The plurality of first through holes HL-4 may serve to discharge gases occurring from layers including an organic layer. The plurality of first through holes HL-4 might not be defined in an area overlapping the clock signal lines CL in the third direction DR3.

Figure 12B:
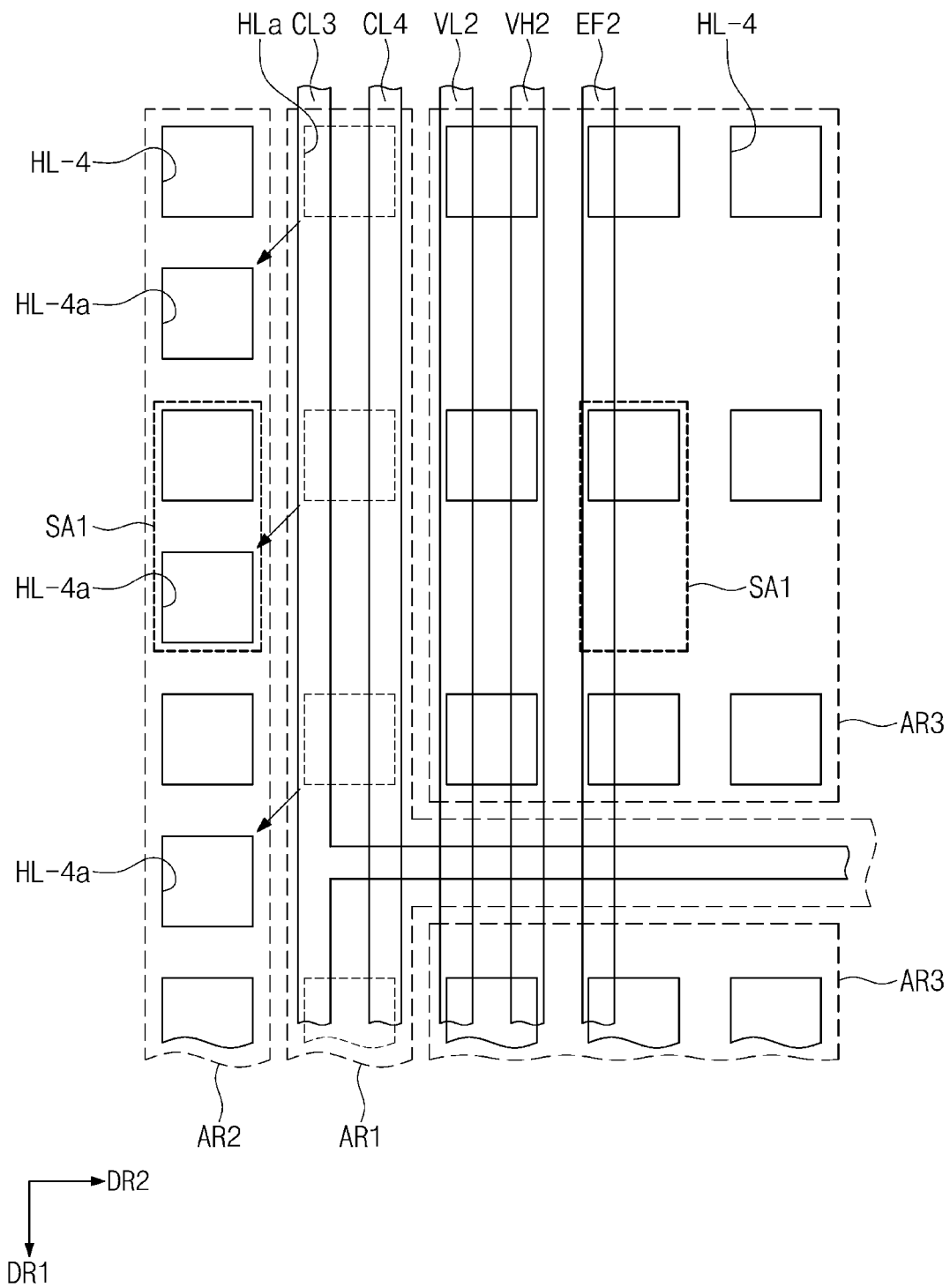
FIG. 12B is an enlarged, fragmented plan view of a portion of the embodiment of FIG. 12A.

FIG. 12B shows a third clock signal line CL3, a fourth clock signal line CL4, a third voltage line VL2, a fourth voltage line VH2, and a second start signal line EF2. The plurality of first through holes HL-4 might not be defined in an area overlapping the third clock signal line CL3 and the fourth clock signal line CL4.

A signal whose level is changed continuously while an image of one frame is displayed may be applied to the third clock signal line CL3 and the fourth clock signal line CL4. Accordingly, if upper parts of the third clock signal line CL3 and the fourth clock signal line CL4 are not shielded, noise may occur from the touch signal lines TSL as a result of that signal. However, referring back to FIG. 12A as well, because the plurality of first through holes HL-4 are not defined in the portion of the first conductive layer EP-L1a that overlaps the third clock signal line CL3 and the fourth clock signal line CL4 in the third direction DR3, the upper parts of the third clock signal line CL3 and the fourth clock signal line CL4 are completely shielded. Accordingly, noise on the touch signal lines TSL might not result from a signal applied to the third clock signal line CL3 and the fourth clock signal line CL4.

The first conductive layer EP-L1a may include a first area AR1, a second area AR2, and a third area AR3. The first area AR1, the second area AR2, and the third area AR3 are shown in FIG. 12B.

The first area AR1 may be an area, which overlaps the clock signal lines CL and where the plurality of first through holes HL-4 are not defined. FIG. 12B shows the first area AR1 overlapping the third and fourth clock signal lines CL3 and CL4. The second area AR2 is an area where the plurality of first through holes HL-4 are defined, and may be an area where a portion exposed by the plurality of first through holes HL-4 and HL-4a has a first area density. The third area AR3 is an area where the plurality of first through holes HL-4 are defined, and may be an area where a portion exposed by the plurality of first through holes HL-4 has a second area density. The second area density may be lower than the first area density. The exposed area may be the third insulation layer 30. For example, the number of the first through holes HL-4 defined in the second area AR2 per a first surface area SA1 may be two and the number of the first through holes HL-4 defined in the third area AR3 per the first surface area SA1 may be one.

Since the plurality of first through holes HL-4 are not defined in the first area AR1 overlapping the third clock signal line CL3 and the fourth clock signal line CL4, in order to compensate for this, a plurality of first through holes HL-4a may be further defined in the second area AR2.

The form of a hole HLa is indicated by a dotted line in the first area AR1. This is just for convenience of description and does not mean that the hole HLa is defined in the first area AR1. Rather, the dotted lines represent theoretical locations where holes HLa could be, but are not actually, defined. If the plurality of first through holes HL-4 were disposed at uniform intervals, the hole HLa should be in the first area AR1 as indicated by the dotted lines. However, in actuality, no hole is defined in the first area AR1. Accordingly, the design condition that a layer (for example, the third insulation layer 30) below the first conductive layer EP-L1a should be exposed more than a predetermined area by the first through holes HL-4 in the first conductive layer EP-Lla might not be satisfied. As a result, gases occurring from layers including an organic material might not be discharged smoothly. In order to prevent this, the first through holes HL-4a may be additionally defined in the second area AR2 in correspondence to the number of holes HLa not defined in the first area AR1. Accordingly, the design condition that a layer (for example, the third insulation layer 30) below the first conductive layer EP-L1a should be exposed more than a predetermined area by the first through holes HL-4 in the first conductive layer EP-L1a may be satisfied despite the omitted holes indicated by the dotted lines in the first area AR1. In order to assist with understanding this concept, an arrow is shown between a virtual hole HLa and the first through holes HL-4a in order to show the hole movement relationship where the holes HLa were moved. The arrow is not an actual component of the apparatus. Rather, the arrows are shown in order to help with conceptual understanding.

Figure 12C:
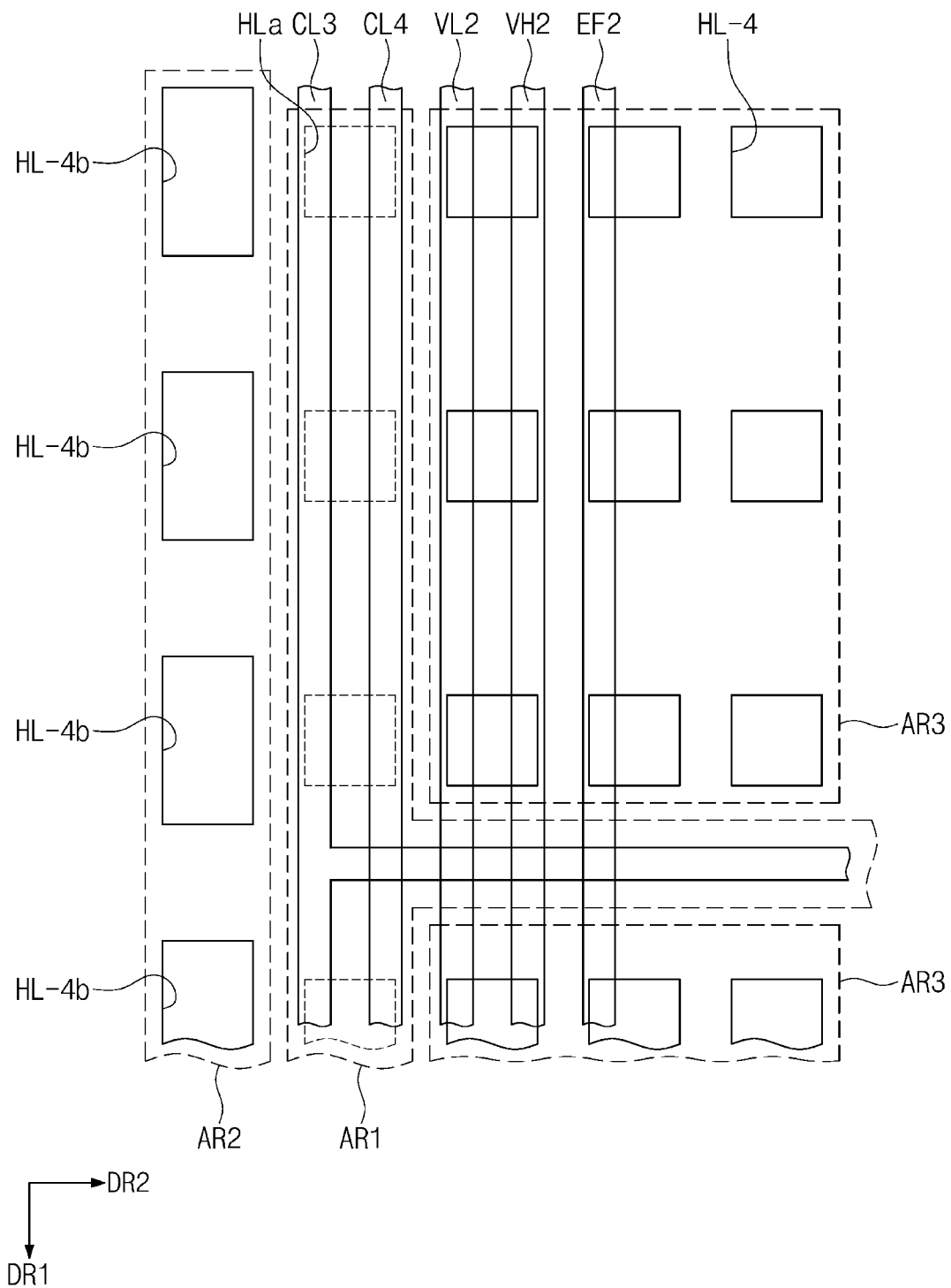
FIG. 12C is an enlarged, fragmented plan view of another embodiment of a portion of display device of FIG. 12A.

Referring to FIG. 12C, since the hole HLa should be in the first area AR1 but no hole is defined in the first area AR1, in order to compensate for this, the size of the first through holes HL-4b disposed in the second area AR2 is expanded in the exemplary embodiment of FIG. 12C.

The expanding of the size of the first through holes HL-4b has the same effect as described above because an exposure area of the third insulation layer 30 (see FIG. 12A) below the first through holes HL-4b becomes enlarged. As a result, the design condition that the first through holes HL-4 should have more than a predetermined area on the conductive portion EP-6 (see FIG. 12A) may still be satisfied despite the omission of through holes HLa in the first area AR1.

Although it is shown in the exemplary embodiment of FIG. 12C that the first through holes HL-4b expand a width in a vertical direction to the first through hole HL-4, the invention is not limited thereto. For example, in relation to the first through holes HL-4b, a width in a horizontal direction to the first through hole HL-4 may expand or widths in a vertical direction and a horizontal direction may both expand.

Figure 13A:
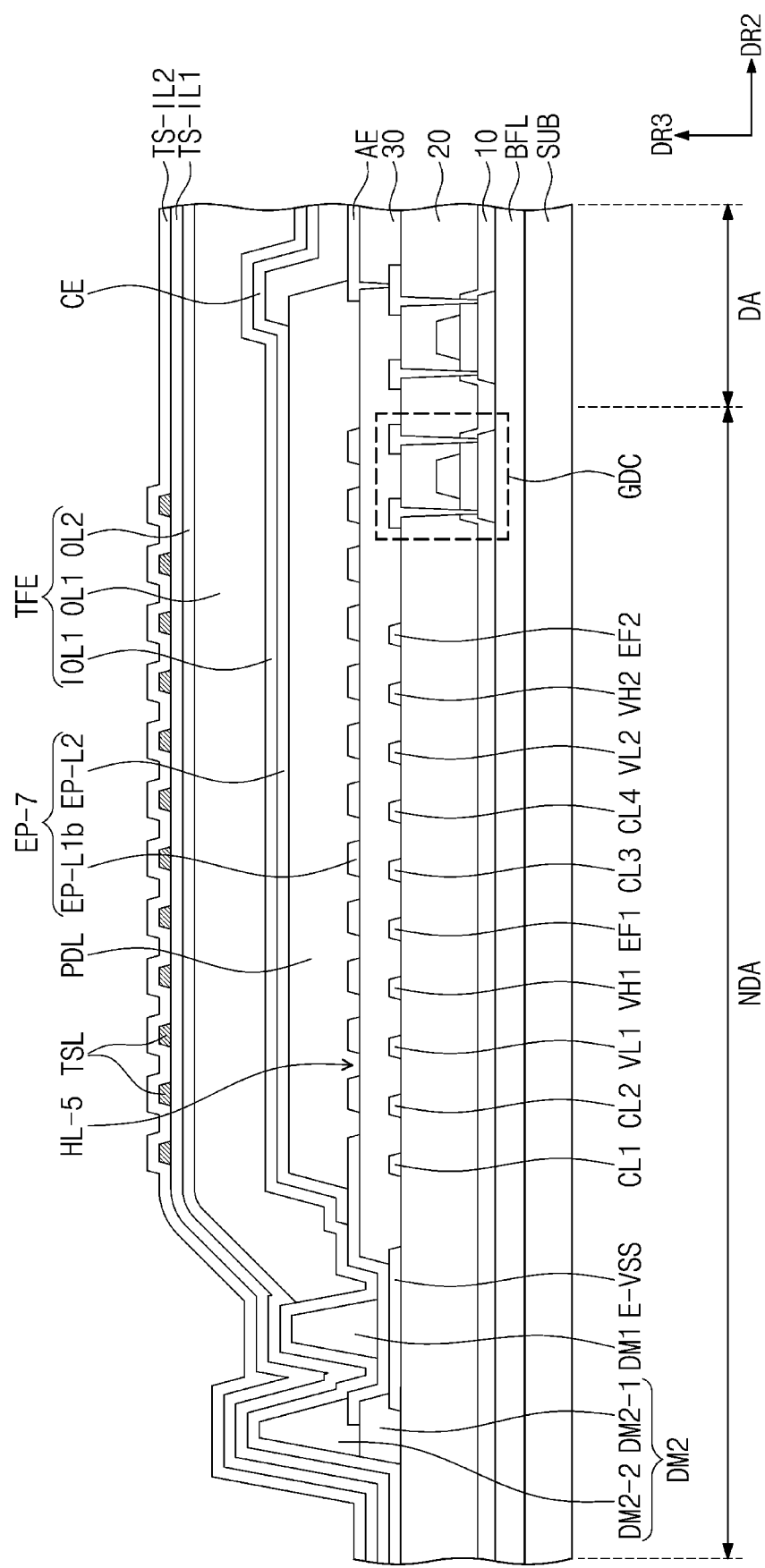
FIG. 13A is an enlarged, fragmented sectional view of another embodiment of area AA of FIG. 5C.

Referring to FIG. 13A, a conductive portion EP-7 may be disposed between the touch signal lines TSL and the plurality of clock signal lines CL. The conductive portion EP-7 may include a first conductive layer EP-L1b and a second conductive layer EP-L2. The first conductive layer EP-L1b may be disposed on the same layer as the first electrode AE and the second conductive layer EP-L2 may be disposed on the same layer as the second electrode CE. For example, the first conductive layer EP-L1b and the first electrode AE may be disposed on the third insulation layer 30, and the second conductive layer EP-L2 and the second electrode CE may be disposed on the pixel definition layer PDL. The first conductive layer EP-L1b and the first electrode AE may be formed through the same process, and the second conductive layer EP-L2 and the second electrode CE may be formed through the same process.

A plurality of first through holes HL-5 may be defined in the first conductive layer EP-L1b. The plurality of first through holes HL-5 may serve to discharge gases occurring from layers including an organic layer. The plurality of first through holes HL-5 might not be defined in an area overlapping the touch signal lines TSL in the third direction DR3.

Figure 13B:
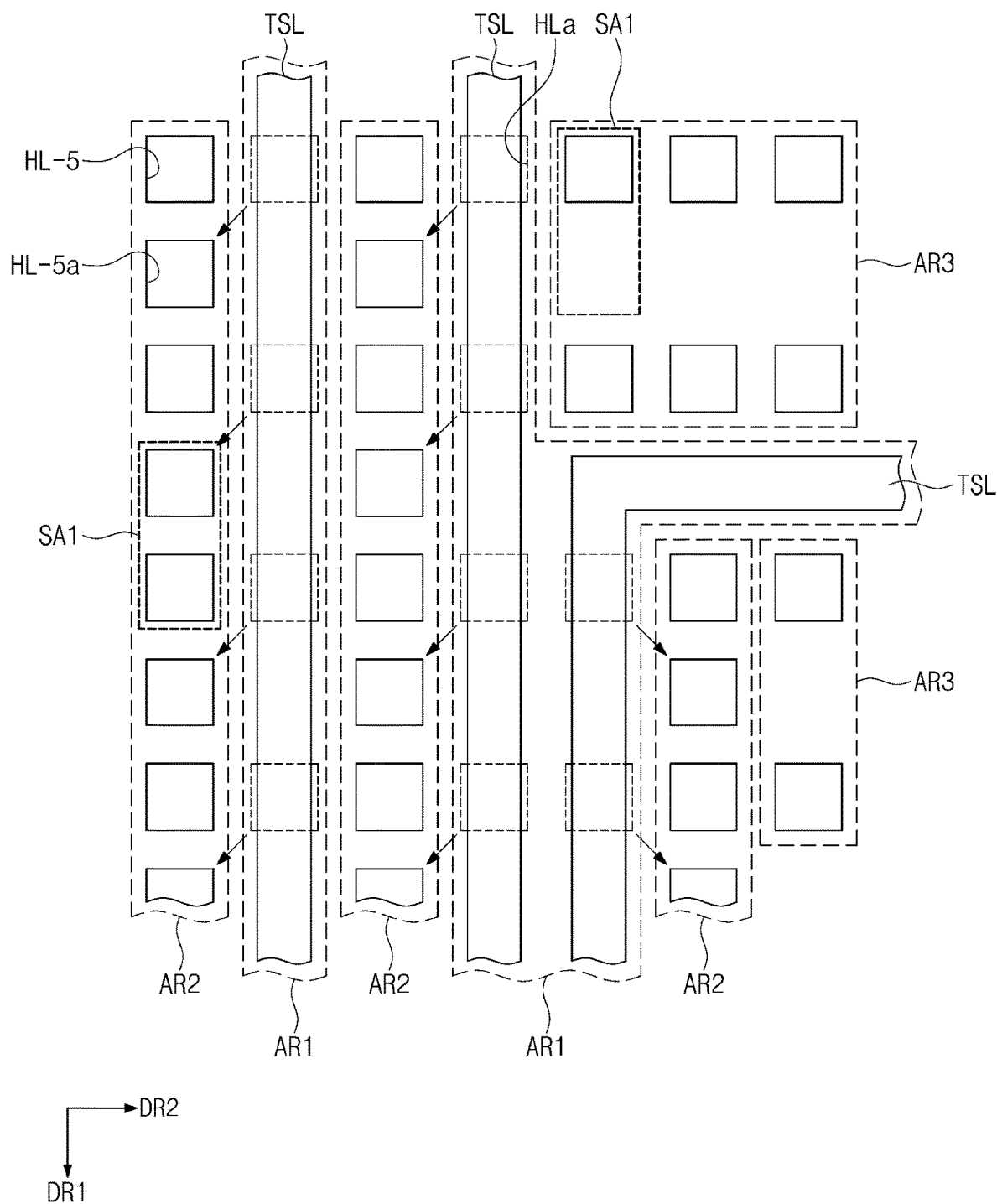
FIG. 13B is an enlarged, fragmented plan view of a portion of the embodiment of FIG. 13A.

Some touch signal lines TSL are exemplarily shown in FIG. 13B. The plurality of first through holes HL-5 might not be defined in an area overlapping the touch signal lines TSL.

Where the plurality of through holes HL-5 are not defined below the touch signal lines TSL in the third direction DR3, the negative influence on signals in the touch signal lines TSL from an AC signal applied to the clock signal lines CL below the touch signal lines TSL in the third direction DR3 may be reduced. Accordingly, noise may be less likely to occur in the touch signal lines TSL and a change in touch sensitivity by noise may be reduced or prevented.

The first conductive layer EP-Llb may include a first area AR1, a second area AR2, and a third area AR3. The first area AR1, the second area AR2, and the third area AR3 are shown in FIG. 13B.

The first area AR1 may be an area, which overlaps the touch signal lines TSL and where the plurality of first through holes HL-5 are not defined. The second area AR2 may be an area where the plurality of first through holes HL-5 and HL-5a are defined, and may be an area where a portion exposed by the plurality of first through holes HL-5 and HL-5a has a first area density. The third area AR3 may be an area where the plurality of first through holes HL-5 are defined, and may be an area where a portion exposed by the plurality of first through holes HL-5 has a second area density. The second area density may be lower than the first area density. The exposed area may be the third insulation layer 30. The number of the first through holes HL-5 defined in the second area AR2 per a first surface area SA1 may be two and the number of the first through holes HL-5 defined in the third area AR3 per the first surface area SA1 may be one.

Since the plurality of first through holes HL-5 are not defined in the first area AR1 overlapping the touch signal lines TSL, in order to compensate for this, a plurality of first through holes HL-5a may be further defined in the second area AR2. For example, the form of a hole HLa is indicated by a dotted line in the first area AR1. This is just for convenience of description and does not mean that the hole HLa is actually defined in the first area AR1. Where the plurality of first through holes HL-5 are disposed at uniform intervals, the hole HLa should be in the first area AR1 as indicated by the dotted lines; but, in actuality, no hole is defined in the first area AR1. Accordingly, the design condition that a layer (for example, the third insulation layer 30) below the first conductive layer EP-L1b is exposed more than a predetermined area by the first through holes HL-5 in the first conductive layer EP-Llb might not be satisfied. As a result, gases occurring from layers including an organic material might not be discharged smoothly. In order to prevent this, the first through holes HL-5a omitted from the first area AR1 may be additionally defined in the second area AR2 in correspondence to the number of holes HLa not defined in the first area AR1. Accordingly, the design condition that a layer (for example, the third insulation layer 30) below the first conductive layer EP-L1b should be exposed more than a predetermined area by the first through holes HL-5 in the first conductive layer EP-L1b may be satisfied.

Although not shown in FIG. 13B, like FIG. 12C, in order to compensate for holes that are not defined in the first area AR1, rather than, or in addition to, the addition of extra through holes HL-5 in the second area AR2, the size of the first through holes HL-5 in the second area AR2 may be enlarged as described above in connection with FIG. 12C.

Figure 14A:
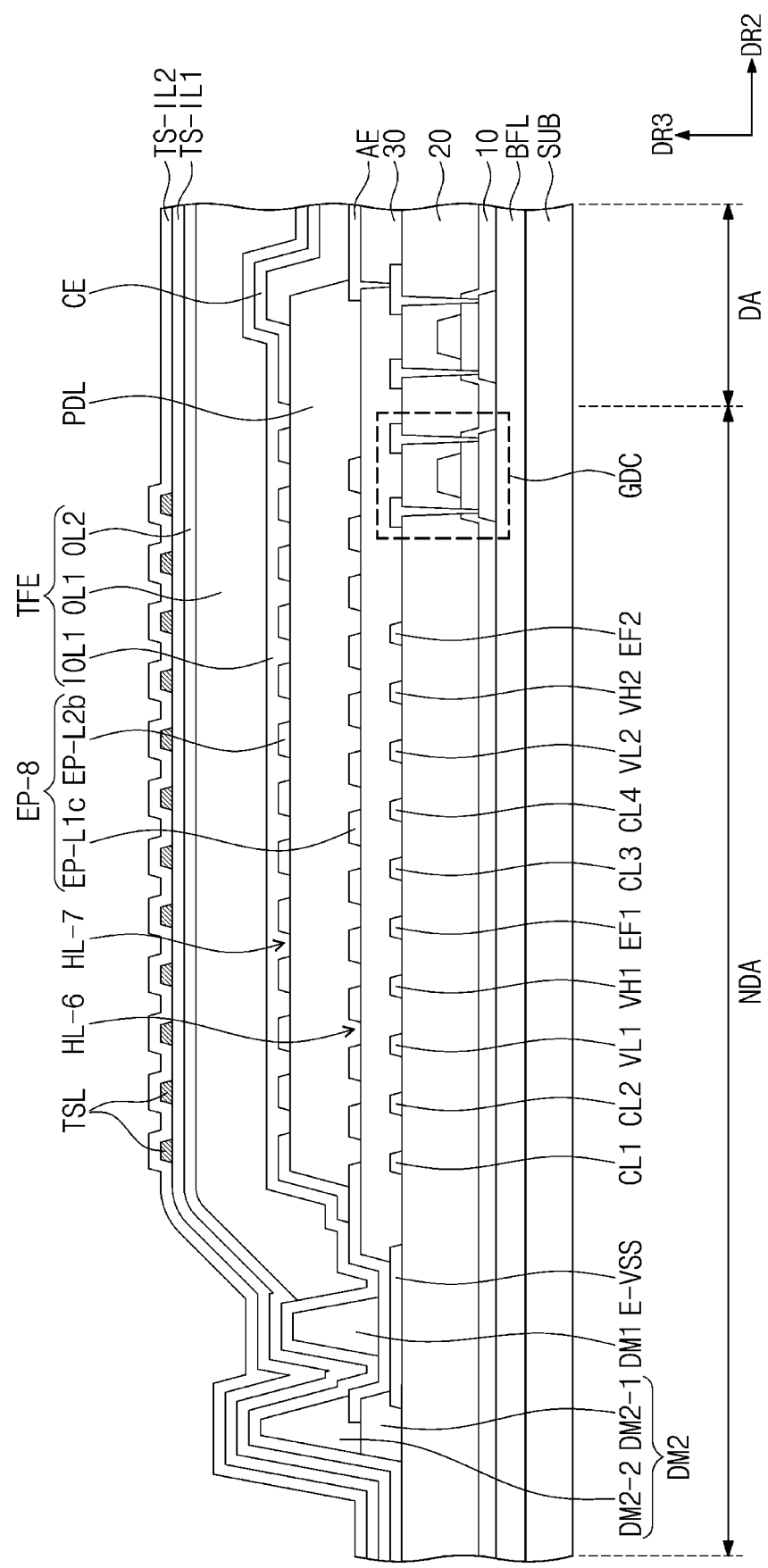
FIG. 14A is an enlarged, fragmented sectional view of yet another embodiment of area AA of FIG. 5C.

Referring now to FIG. 14A, a conductive portion EP-8 may be disposed between the touch signal lines TSL and the plurality of clock signal lines CL. The conductive portion EP-8 may include a first conductive layer EP-L1c and a second conductive layer EP-L2b. The first conductive layer EP-L1c may be disposed on the same layer as the first electrode AE and the second conductive layer EP-L2b may be disposed on the same layer as the second electrode CE.

A plurality of first through holes HL-6 may be defined in the first conductive layer EP-L1c. The plurality of first through holes HL-6 may serve to discharge gases occurring from layers including an organic layer. A plurality of second through holes HL-7 may be defined in the second conductive layer EP-L2b. The plurality of second through holes HL-7 may serve to discharge gases occurring from layers including an organic layer.

The first through holes HL-6 and the second through holes HL-7 might not overlap each other in the third direction DR3. Accordingly, an area where the first through holes HL-6 are formed may be covered by the second conductive layer EP-L2b in the third direction DR3, and an area where the second through holes HL-7 are formed may be covered by the first conductive layer EP-L1c in the third direction DR3. According to this embodiment, an overlapping area between the touch signal lines TSL and the plurality of clock signal lines CL may be shielded by at least one of the first conductive layer EP-L1c and the second conductive layer EP-L2b. That is, the conductive portion EP-8 may reduce a change of a touch sensitivity caused by noise occurring in the touch signal lines TSL by a signal in the clock signal lines CL.

Figure 14B:
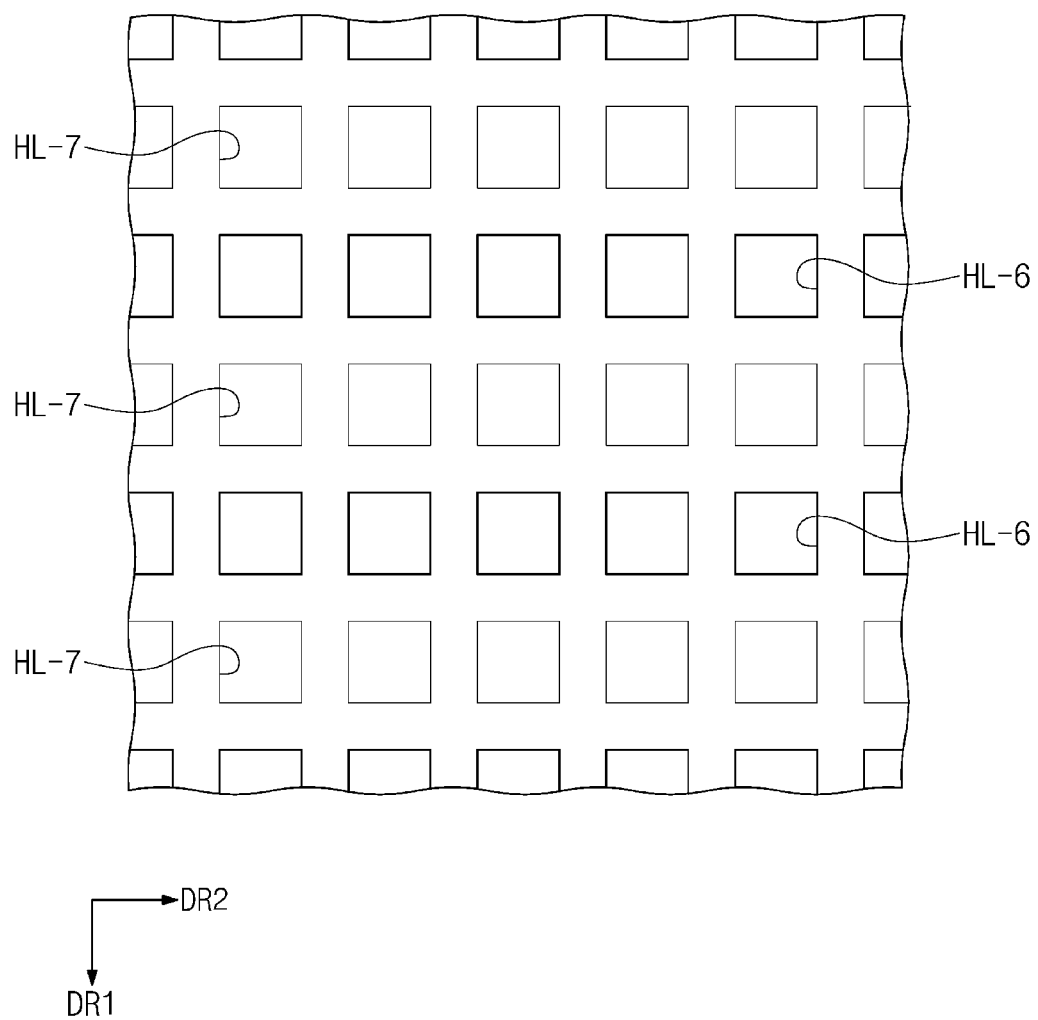
FIG. 14B is an enlarged, fragmented plan view of the embodiment of FIG. 14 A.

Although it is shown in FIG. 14B that the plurality of first through holes HL-6 and the plurality of second through holes HL-7 are arranged in the second direction DR2 and are disposed along the first direction DR1 alternately, the inventive concepts are not limited thereto. The plurality of first through holes HL-6 and the plurality of second through holes HL-7 do not overlap each other in the third direction DR3 and these through holes HL-6, HL-7 have various other arrangements in various exemplary embodiments. For example, the plurality of first through holes HL-6 and the plurality of second through holes HL-7 may be disposed alternately in the first direction DR1 and the second direction DR2.

A display device constructed according to the principles of the inventive concepts includes a conductive portion for covering an overlapping area where a plurality of clock signal lines and a plurality of touch signal lines overlap. The conductive portion may reduce or prevent noise from occurring on the touch signal lines by changes in levels of signals applied to the clock signal lines. That is, the conductive portion may reduce or prevent a touch sensitivity of a touch detection unit from being affected by the noise.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
   a display panel comprising a base layer, a light emitting element layer disposed on the base layer, first signal lines disposed on the base layer, a power supply line disposed on the base layer, first and second conductive layers overlapping each other and overlapping the first signal lines, and an encapsulation layer disposed on the light emitting element layer;
   an insulation layer disposed on the encapsulation layer;
   sensing electrodes disposed on the insulation layer; and
   second signal lines disposed on the insulation layer and electrically connected to the sensing electrodes, respectively,
   wherein:
   the first and second conductive layers are disposed between the first signal lines and the second signal lines and are both electrically connected to the power supply line;
   each of an upper surface of the encapsulation layer and a bottom surface of the insulation layer includes an uneven-shaped portion having a peak and a valley;
   an upper surface of the insulation layer includes an uneven-shaped portion having a peak and a valley and a flat portion;
   the sensing electrodes and the second signal lines are directly disposed on the flat portion of the upper surface of the insulation layer; and
   the power supply line is disposed below the uneven-shaped portion of the bottom surface of the insulation layer.

2. The display device of claim 1, wherein the bottom surface of the insulation layer and the upper surface of the encapsulation layer directly contact each other.

3. The display device of claim 1, wherein:
   the light emitting element layer comprises a first electrode, an organic light emitting layer disposed on the first electrode, and a second electrode disposed on the organic light emitting layer;
   the second conductive layer is disposed on a same layer as the second electrode; and
   the first conductive layer is disposed on a same layer as the first electrode.

4. The display device of claim 3, wherein the second electrode extends toward the second conductive layer, and the second electrode and the second conductive layer are connected to each other.

5. The display device of claim 1, wherein the first signal lines are clock signal lines to which clock signals are applied.

6. The display device of claim 1, wherein the display panel further includes a gate driving circuit, and each of the first signal lines provides clock signals to the gate driving circuit.

7. The display device of claim 1, wherein the encapsulation layer includes at least one inorganic layer and at least one organic layer.

8. The display device of claim 1, wherein:
   a plurality of through holes are defined in the first conductive layer; and
   the plurality of through holes are non-overlapping with the first signal lines or the second signal lines.

9. The display device of claim 8, wherein the first conductive layer comprises:
   a first area, where the plurality of through holes are not defined, overlapping at least one of the first signal lines and at least one of the second signal lines;
   a second area comprising an area exposed by the plurality of through holes having a first area density of holes; and
   a third area comprising an area exposed by the plurality of through holes having a second area density of holes lower than the first area density.

10. The display device of claim 9, wherein a number of first through holes defined in the second area per a first surface area is greater than a number of second through holes defined in the third area per the first surface area.

11. The display device of claim 9, wherein a size of a first through hole defined in the second area is greater than a size of a second through hole defined in the third area.

12. The display device of claim 1, further comprising sensing pads electrically connected to the second signal lines, respectively.

13. The display device of claim 1, wherein the display panel includes a display area and a non-display area adjacent to the display area, and an upper surface of the display panel overlapping the non-display area includes an uneven-shaped portion.

14. The display device of claim 13, wherein the insulation layer is directly disposed on the upper surface of the display panel.

15. The display device of claim 13, wherein the first signal lines and the second signal lines are disposed in the non-display area.

16. The display device of claim 13, wherein at least a portion of the first and second conductive layers are disposed in the non-display area.

17. An electronic device comprising:
a display panel comprising a base layer, a light emitting element layer disposed on the base layer, first signal lines disposed on the base layer, a power supply line disposed on the base layer, first and second conductive layers overlapping each other and overlapping the first signal lines, and an encapsulation layer disposed on the light emitting element layer;
a window disposed on the display panel;
an insulation layer disposed between the encapsulation layer and the window;
sensing electrodes disposed between the insulation layer and the window; and
second signal lines disposed between the insulation layer and the window and electrically connected to the sensing electrodes, respectively,
wherein:
the first and second conductive layers are disposed between the first signal lines and the second signal lines and are both electrically connected to the power supply line;
each of an upper surface of the encapsulation layer and a bottom surface of the insulation layer includes an uneven-shaped portion having a peak and a valley;
an upper surface of the insulation layer includes an uneven-shaped portion having a peak and a valley and a flat portion;
the sensing electrodes and the second signal lines are directly disposed on the flat portion of the upper surface of the insulation layer; and
the power supply line is disposed below the uneven-shaped portion of the bottom surface of the insulation layer.

18. The electronic device of claim 17, wherein the electronic device is one of a mobile phone, a tablet, a car navigation, a game console, a smart watch, a television, or a monitor.

* * * * *